(12) United States Patent
Li et al.

(10) Patent No.: US 12,272,317 B2
(45) Date of Patent: Apr. 8, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhengkun Li, Beijing (CN); De Li, Beijing (CN); Haigang Qing, Beijing (CN); Yue Long, Beijing (CN); Cong Liu, Beijing (CN); Qiwei Wang, Beijing (CN); Binyan Wang, Beijing (CN); Zhongliu Yang, Beijing (CN); Tianyi Cheng, Beijing (CN); Ni Yang, Beijing (CN); Qiyang Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/028,830

(22) PCT Filed: Apr. 22, 2022

(86) PCT No.: PCT/CN2022/088425
§ 371 (c)(1),
(2) Date: Mar. 28, 2023

(87) PCT Pub. No.: WO2023/201693
PCT Pub. Date: Oct. 26, 2023

(65) Prior Publication Data
US 2024/0363079 A1    Oct. 31, 2024

(51) Int. Cl.
G09G 3/32        (2016.01)
G09G 3/3275    (2016.01)

(52) U.S. Cl.
CPC ............ G09G 3/3275 (2013.01); G09G 3/32 (2013.01); *G09G 2300/0426* (2013.01);
(Continued)

(58) Field of Classification Search
CPC .................................................. G09G 3/3233
See application file for complete search history.

(56) References Cited

U.S. PATENT DOCUMENTS

| | | | | |
|---|---|---|---|---|
| 2006/0056267 A1* | 3/2006 | Kim | ...................... | G09G 3/3677 365/230.06 |
| 2010/0238149 A1* | 9/2010 | Kishi | ................... | G09G 3/3233 345/206 |

(Continued)

FOREIGN PATENT DOCUMENTS

| | | |
|---|---|---|
| CN | 112151592 A | 12/2020 |
| CN | 113410269 A | 9/2021 |

(Continued)

OTHER PUBLICATIONS

Extended (Supplementary) European Search Report dated Jul. 15, 2024, issued in counterpart EP Application No. 22937929.2. (9 pages).

*Primary Examiner* — Nan-Ying Yang
(74) *Attorney, Agent, or Firm* — WHDA, LLP

(57) ABSTRACT

Provided are a display substrate and a display device. The display substrate includes a base substrate, and a driving circuit layer and a light-emitting device layer on the base substrate. The display substrate includes a light-transmitting display area and a normal display area, the normal display area surrounds at least a portion of the light-transmitting display area. The normal display area includes multiple normal driving circuits and multiple dummy driving circuits;

(Continued)

some dummy driving circuit are used for driving light-emitting devices located in the light-transmitting display area. The display substrate further includes multiple normal data lines coupled to the normal driving circuits; at least one normal data line is coupled to a data signal input terminal through a data lead; an orthographic projection of the data lead onto the base substrate at least partially overlaps an orthographic projection of the dummy driving circuit onto the base substrate.

19 Claims, 23 Drawing Sheets

(52) U.S. Cl.
CPC . *G09G 2310/0275* (2013.01); *G09G 2310/08* (2013.01); *G09G 2320/0233* (2013.01)

(56) References Cited

U.S. PATENT DOCUMENTS

| | | | |
|---|---|---|---|
| 2016/0035811 A1* | 2/2016 | Choi | H10K 59/131 |
| | | | 257/72 |
| 2022/0045141 A1 | 2/2022 | Zhang et al. | |
| 2022/0069047 A1 | 3/2022 | Yang et al. | |
| 2022/0093682 A1 | 3/2022 | Chang et al. | |
| 2022/0102421 A1 | 3/2022 | Yang et al. | |
| 2022/0199742 A1* | 6/2022 | Jeon | H01L 27/124 |
| 2022/0310023 A1 | 9/2022 | Shang et al. | |
| 2022/0310708 A1 | 9/2022 | Dai et al. | |

FOREIGN PATENT DOCUMENTS

| | | |
|---|---|---|
| CN | 113744649 A | 12/2021 |
| CN | 113964142 A | 1/2022 |
| CN | 114190108 A | 3/2022 |
| WO | 2021/239112 A1 | 12/2021 |
| WO | 2021/258318 A1 | 12/2021 |
| WO | 2022/041240 A1 | 3/2022 |

* cited by examiner

DISPLAY SUBSTRATE AND DISPLAY DEVICE

This application is the U.S. national phase of PCT Application No. PCT/CN2022/088425 filed on Apr. 22, 2022, the entire contents of which are hereby incorporated by reference.

TECHNICAL FIELD

The present disclosure relates to the technical field of display, and particularly, to a display substrate and a display device.

BACKGROUND

In recent years, with the progress of the display technology, Organic Light Emitting Diode (short for OLED) display is one of the hot spots in the field of flat panel display research, and more and more Active Matrix Organic Light Emitting Diodes (short for AMOLED) display panels have entered the market. As compared to conventional Thin Film Transistor Liquid Crystal Display (short for TFTLCD), AMOLED display panels have faster response, higher contrast, and wider viewing angles. Moreover, with the development of display technology, electronic devices are constantly moving towards narrow frames and achieving full screens.

SUMMARY

The objective of the present disclosure is to provide a display substrate and a display device.

To achieve the above-mentioned objective, the present disclosure provides the following technical solutions.

A first aspect of the present disclosure provides a display substrate, including a base substrate, and a driving circuit layer and a light-emitting device layer located on the base substrate. The display substrate includes a light-transmitting display area and a normal display area, the normal display area surrounds at least a portion of the light-transmitting display area; the normal display area includes a plurality of normal driving circuits and a plurality of dummy driving circuits; some of the dummy driving circuits are configured to drive light-emitting devices located in the light-transmitting display area. The display substrate further includes: a plurality of normal data lines coupled to the normal driving circuits; where at least one of the normal data lines is coupled to a data signal input terminal through a data lead; an orthographic projection of at least a portion of the data lead onto the base substrate at least partially overlaps with an orthographic projection of the dummy driving circuits onto the base substrate.

Optionally, the data lead includes a first line segment and a second line segment coupled to each other, the first line segment includes at least a portion extending along a first direction, the second line segment includes at least a portion extending along a second direction, and the first direction intersects the second direction;

the plurality of dummy driving circuits is divided into a plurality of columns of dummy driving circuits, and each column of dummy driving circuits includes a plurality of dummy driving circuits arranged along the second direction; and the first line segment is coupled to the normal data line, and the second line segment is coupled to the data signal input terminal; an orthographic projection of the second line segment onto the base substrate at least partially overlaps with an orthographic projection of at least some of dummy driving circuits included in a corresponding column of dummy driving circuits onto the base substrate.

Optionally, the data lead further includes a first conductive connection part and a second conductive connection part; the first conductive connection part is coupled to the first line segment and the normal data line; and the second conductive connection part is coupled to the first line segment and the second line segment.

Optionally, each of the first conductive connection part and the second conductive connection part is formed in an integrate structure with the first line segment.

Optionally, the normal driving circuit includes a driving transistor; the first conductive connection part includes at least a portion extending along the second direction, and an orthographic projection of the first conductive connection part onto the base substrate and an orthographic projection of a gate electrode of the driving transistor onto the base substrate are arranged along the first direction; the first conductive connection part and the second conductive connection part that are coupled to the first line segment are located on a same side of the first line segment along the second direction; or, the first conductive connection part and the second conductive connection part that are coupled to the first line segment are located on two opposite sides of the first line segment along the second direction.

Optionally, the display substrate further includes a gate line and a light-emitting control line, the orthographic projection of the first conductive connection part onto the base substrate at least partially overlaps with an orthographic projection of the gate line onto the base substrate and an orthographic projection of the light-emitting control line onto the base substrate.

Optionally, the display substrate further includes a first initialization signal line, and an orthographic projection of the second conductive connection part onto the base substrate at least partially overlaps with an orthographic projection of the first initialization signal line onto the base substrate.

Optionally, the display substrate further includes a light-emitting control line, and an orthographic projection of the second conductive connection part onto the base substrate at least partially overlaps with an orthographic projection of the light-emitting control line onto the base substrate.

Optionally, the plurality of normal driving circuits are divided into a plurality of columns of normal driving circuits, each column of normal driving circuits includes a plurality of normal driving circuits arranged along the second direction; and the plurality of columns of normal driving circuits are divided into a plurality of circuit groups, and each of the circuit groups includes at least two columns of normal driving circuits; and the circuit group and one column of dummy driving circuits are alternately arranged along the first direction.

Optionally, each of the circuit groups includes two columns of normal driving circuits or four columns of normal driving circuits.

Optionally, the plurality of dummy driving circuits include a plurality of first dummy driving circuits and a plurality of second dummy driving circuits, and the first dummy driving circuit is coupled to one of the light-emitting devices located in the light-transmitting display area through a connection line, and configured to drive the light-emitting device; and an orthographic projection of at least some of the second dummy driving circuits onto the base substrate partially overlaps with an orthographic projection of at least two of the second line segments onto the base substrate.

Optionally, the display substrate further includes a plurality of power supply lines and a plurality of normal data lines; and the orthographic projection of at least some of the second dummy driving circuits onto the base substrate does not overlap with an orthographic projection of the power supply line onto the base substrate.

Optionally, the display substrate further includes a plurality of dummy data lines coupled to the dummy driving circuits; and the orthographic projection of at least some of the second dummy driving circuits onto the base substrate partially overlaps with an orthographic projection of three or four of the second line segments onto the base substrate; and at least a portion of the dummy data lines is reused as the second line segment.

Optionally, the plurality of normal driving circuits and the plurality of dummy driving circuits is divided into a plurality of driving circuit rows; the plurality of driving circuit rows includes a plurality of first driving circuit rows and a plurality of second driving circuit rows;

an orthographic projection of the first line segment onto the base substrate partially overlaps with an orthographic projection of a corresponding one of the first driving circuit rows onto the base substrate; and the display substrate further includes a plurality of first compensation lines; the first compensation line includes at least a portion extending along the first direction; the first compensation line and the first line segment are provided in a same layer and made of a same material; an orthographic projection of a portion of the first compensation line onto the base substrate at least partially overlaps with an orthographic projection of a corresponding one of the second driving circuit rows onto the base substrate; and another portion of the first compensation line and the first line segment are arranged along the first direction.

Optionally, the display substrate further includes a plurality of second initialization signal lines and a plurality of light-emitting control lines;

the orthographic projection of the first line segment onto the base substrate is located between an orthographic projection of one of the second initialization signal lines coupled to one of the first driving circuit rows corresponding to the first line segment onto the base substrate, and an orthographic projection of one of the light-emitting control lines coupled to one of the first driving circuit rows corresponding to the first line segment onto the base substrate; and/or, the orthographic projection of a portion of the first compensation line onto the base substrate is located between an orthographic projection of one of the second initialization signal lines coupled to one of the second driving circuit rows corresponding to the first compensation line onto the base substrate, and an orthographic projection of one of the light-emitting control lines coupled to one of the second driving circuit rows corresponding to the first compensation line onto the base substrate.

Optionally, each of the first compensation lines is coupled to one of the power supply lines in the display substrate.

Optionally, the display substrate further includes a plurality of second compensation lines; the second compensation line includes at least a portion extending along the second direction; the second compensation line and the second line segment are provided in a same layer and made of a same material; an orthographic projection of a portion of the second compensation line onto the base substrate at least partially overlaps with an orthographic projection of a corresponding column of the normal driving circuits onto the base substrate; and another portion of the second compensation line and the second line segment are arranged along the second direction.

Optionally, the display substrate includes a first source-drain metal layer, a first planarization layer, and a second source-drain metal layer that are sequentially stacked along a direction away from the base substrate; and the first line segment is fabricated by using the first source-drain metal layer, and the second line segment is fabricated by using the second source-drain metal layer.

Optionally, the display substrate includes a first source-drain metal layer, a passivation layer, an intermediate source-drain metal layer, a first planarization layer, and a second source-drain metal layer that are sequentially stacked along a direction away from the base substrate. The first line segment is fabricated by using the first source-drain metal layer, the second line segment is fabricated by using the second source-drain metal layer, and the first conductive connection part and the second conductive connection part are fabricated by using the intermediate source-drain metal layer.

Based on the technical solutions of the display substrate, a second aspect of the present disclosure provides a display device. The display device further includes an encapsulation layer and a driving chip, the driving chip is coupled to the display substrate, and the encapsulation layer covers the display substrate.

BRIEF DESCRIPTION OF THE DRAWINGS

The drawings described herein are intended to provide a further understanding of the present disclosure and constitute a portion of the present disclosure, and the illustrative embodiments of the present disclosure and their descriptions are used to explain the present disclosure and do not constitute an improper limitation of the present disclosure. In the drawings.

DETAILED DESCRIPTION

Figure 1:
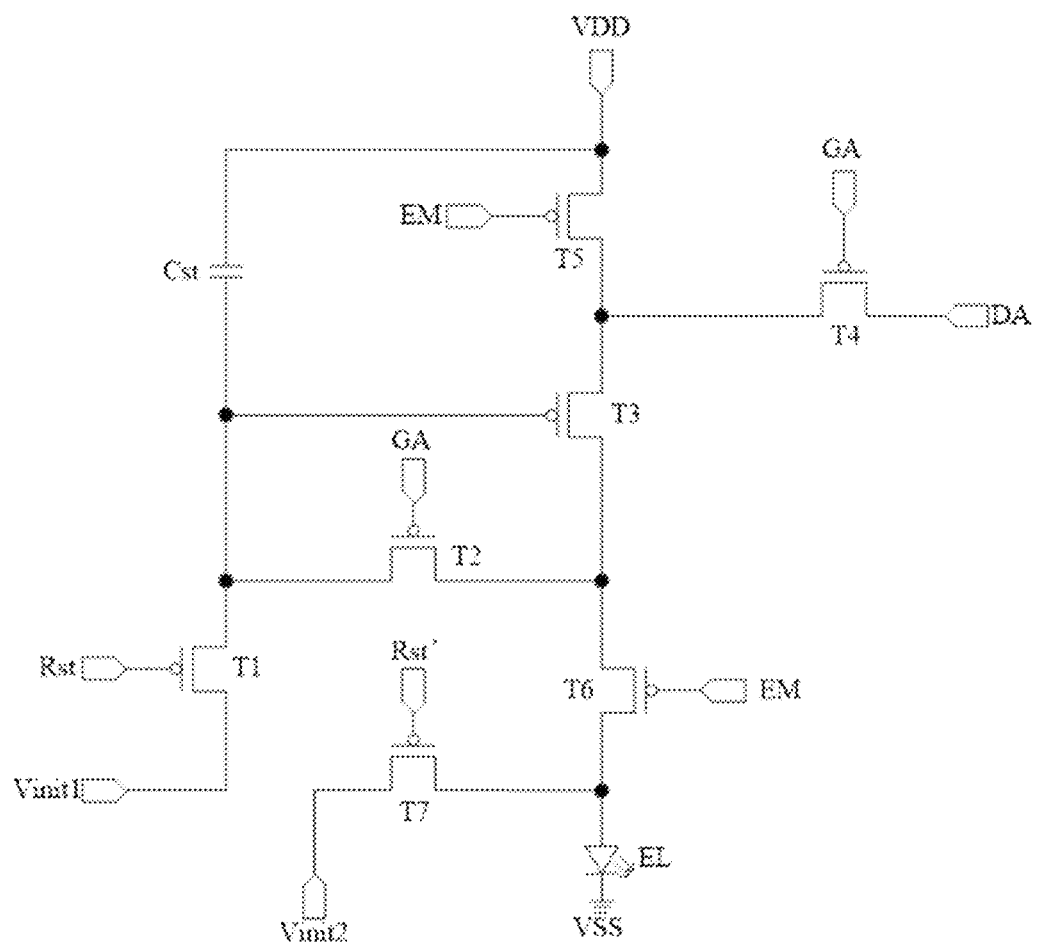
FIG. 1 is a circuit structure diagram of a driving circuit provided in an embodiment of the present disclosure.

To further explain the display substrate and the display device provided by the embodiments of the present disclosure, a detailed description will be made in conjunction with the accompanying drawings.

In a general display product, a lower frame is wider, and data leads may be alternately arranged by using a first gate metal layer and a second gate metal layer, and data signals are provided for data lines through the data leads. However, in a display product with a narrow frame, the lower frame is relatively narrow, and the layout space of the lower fillet positions on the left and right sides of the lower frame is also small, which results in that the above-mentioned alternative trace scheme cannot be realized in this space.

Based on the existence of the above-mentioned problem, the present disclosure lays out at least a portion of data leads in a display area (Active Area, AA area) of a display product, couples the data lead with a data line to which the data lead is connected in the display area, and then the data lead extends downwards from a position near a middle region of the display area to the lower frame of the display product, and couples with a data signal input terminal at the lower frame, thereby providing a data signal for the data line. The above scheme is Fanout In AA (FIAA) technique.

However, when using the above-mentioned FIAA technique, the data lead would overlap with a pixel driving circuit for driving in the display product, resulting in a relatively large loading of the pixel driving circuit, affecting the display performance of the display product.

With reference to FIGS. 3, 4, 5, 14, 22, 23, and 30, embodiments of the present disclosure provide a display substrate, including a base substrate, and a driving circuit layer and a light-emitting device layer located on the base substrate. The display substrate includes a light-transmitting display area 1 and a normal display area 2, the normal display area 2 surrounds at least a portion of the light-transmitting display area 1. The normal display area 2 includes multiple normal driving circuits 21 and multiple dummy driving circuits 22; part of the dummy driving circuits 22 is used for driving a light-emitting device located in the light-transmitting display area.

The display substrate further includes: multiple normal data lines coupled to the normal driving circuits 21. At least one of the normal data lines is coupled to a data signal input terminal through a data lead 3; an orthographic projection of at least a portion of the data lead 3 onto the base substrate at least partially overlaps with an orthographic projection of the dummy driving circuits 22 onto the base substrate.

Illustratively, the display substrate uses a Full Display with Camera (short for FDC).

Illustratively, the driving circuit layer includes multiple normal driving circuits 21 and multiple dummy driving circuits 22, and at least a portion of the driving circuit layer is located in the normal display area. The light-emitting device layer includes a light-emitting device located in the normal display area, and a light-emitting device located in the light-transmitting display area.

Illustratively, the display substrate includes a light-transmitting display area 1 and a normal display area 2. In addition to cover a camera, the light-transmitting display area 1 may also cover other sensors, such as a distance sensor and a fingerprint sensor. A pixel driving circuit may or may not be provided in the light-transmitting display area 1 according to actual needs. The normal display area 2 includes multiple normal driving circuits 21 and multiple dummy driving circuits 22. The normal driving circuit 21 is used for driving the light-emitting device located in the normal display area 2, a portion of the dummy driving circuits 22 is used for driving the light-emitting device located in the light-transmitting display area 1, and another portion of the dummy driving circuits 22 have no driving function.

Figure 31:
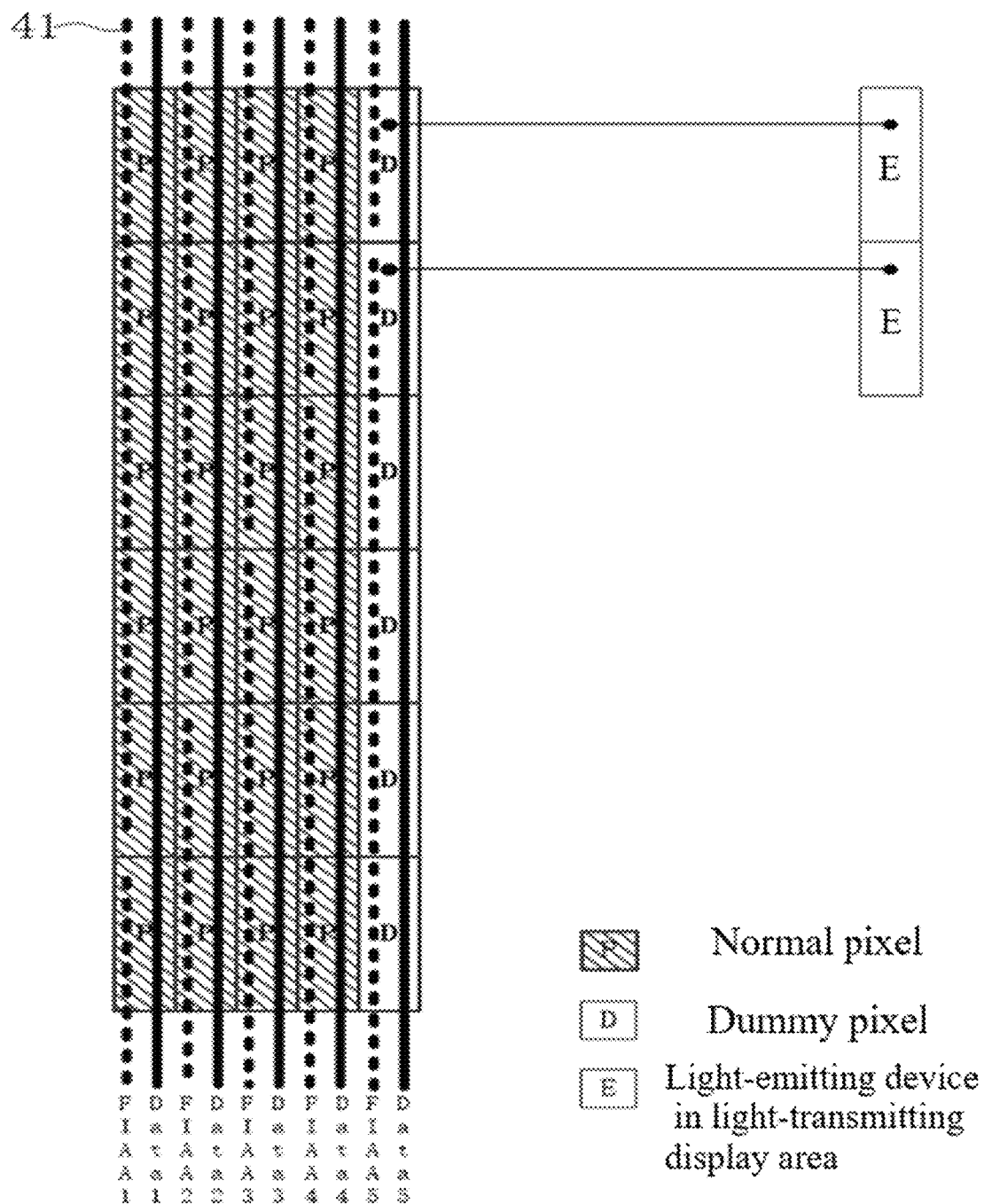
FIG. 31 is a schematic diagram of some of dummy driving circuits for driving light-emitting devices located in a light-transmitting display area in a four-to-one scheme provided in an embodiment of the present disclosure.

In more detail, referring to FIG. 31, a dummy pixel D includes a dummy driving circuit, and in a column of the dummy pixels D illustrated in FIG. 31, some of the dummy pixels D include dummy driving circuits coupled to the light-emitting devices E, which are located in the light-transmitting display area 1 and configured to drive the light-emitting devices located in the light-transmitting display area 1. The dummy driving circuits included in some other of the dummy pixels D is not coupled to the light-emitting devices E located in the light-transmitting display area 1, and has no driving effect.

FIG. 31 is a schematic diagram of some dummy driving circuits for driving the light-emitting devices E located in the light-transmitting display area 1 in a four-to-one scheme. FIG. 31 shows four columns of normal pixels P and one column of dummy pixels D. The normal pixel P includes a normal driving circuit, and the dummy pixel D includes a dummy driving circuit.

An orthographic projection of normal driving circuits included in the first column of normal pixels onto the base substrate at least partially overlaps with an orthographic projection of a corresponding first normal data line Data1 onto the base substrate, an orthographic projection of the first one FIAA1 of second line segments onto the base substrate, and an orthographic projection of a second compensation line 41 onto the base substrate.

An orthographic projection of normal driving circuits included in the second column of normal pixels onto the base substrate at least partially overlaps with an orthographic projection of a corresponding second normal data line Data2 onto the base substrate, an orthographic projection of the second one FIAA2 of the second line segments onto the base substrate, and an orthographic projection of a second compensation line 41 onto the base substrate.

An orthographic projection of normal driving circuits included in the third column of normal pixels onto the base substrate at least partially overlaps with an orthographic projection of a corresponding third normal data line Data3 onto the base substrate, an orthographic projection of the third one FIAA3 of the second line segments onto the base substrate, and an orthographic projection of a second compensation line 41 onto the base substrate.

An orthographic projection of normal driving circuits included in the fourth column of normal pixels onto the base substrate at least partially overlaps with an orthographic projection of a corresponding fourth normal data line Data4 onto the base substrate, an orthographic projection of the fourth one FIAA4 of the second line segments onto the base substrate, and an orthographic projection of a second compensation line 41 onto the base substrate.

An orthographic projection of dummy driving circuits included in the fifth column of dummy pixels onto the base substrate at least partially overlaps with an orthographic projection of a corresponding fifth dummy data line Data5 onto the base substrate, an orthographic projection of the fifth one FIAA5 of the second line segments onto the base substrate, and an orthographic projection of a second compensation line 41 onto the base substrate.

Illustratively, in the four-to-one scheme provided by the embodiments of the present disclosure, an orthographic projection of a portion of the second line segment 32 onto the base substrate at least partially overlaps an orthographic projection of the dummy driving circuits onto the base substrate. An orthographic projection of another portion of the second line segment 32 onto the base substrate at least partially overlaps an orthographic projection of the normal driving circuits onto the base substrate.

Illustratively, the display substrate includes multiple normal data lines DA, which include at least a portion extending along the second direction. The normal data line DA is coupled to each of the normal driving circuits 21 in a corresponding column of normal driving circuits 21 for providing a data signal to each normal driving circuit 21 coupled thereto.

Illustratively, the normal driving circuit 21 and the dummy driving circuit 22 both include a 7T1C circuit structure, i.e., 7 transistors and 1 capacitor, but are not limited thereto.

Illustratively, the data signal input terminal is located at a lower frame of the display substrate. The data signal input terminal may include, but is not limited to, a driving chip.

According to the above-mentioned specific structure of the display substrate, it can be seen that in the display substrate provided by the embodiments of the present disclosure, by arranging that a first end of the data lead 3 couples to a corresponding normal data line DA, and a second end of the data lead 3 couples to a data signal input terminal, the data lead 3 can extend downwards from a position near a middle region of the normal display area 2 to the lower frame of the display product, and couples to the data signal input terminal in the lower frame, thereby providing a data signal for the normal data line DA. Thus, even if the display substrate is used in a display product with a narrow frame, the data leads 3 can be well laid out in the lower frame.

In addition, in the display substrate provided by the embodiments of the present disclosure, by arranging that an orthographic projection of the data lead 3 onto the base substrate at least partially overlaps with an orthographic projection of the dummy driving circuit 22 onto the base substrate, at least a portion of the data lead 3 can be located in the layout region of the dummy driving circuit 22, and most of the loading generated by the data lead 3 is distributed in the layout region of the dummy driving circuit 22, so that the data lead 3 does not generate a large parasitic capacitance to a normal sub-pixel to which a normal driving circuit 21 belong. Thus, the influence of the data lead 3 on the normal driving circuit 21 is effectively reduced, the function of the normal sub-pixel is better realized, and a more excellent display effect is realized.

Figure 2:
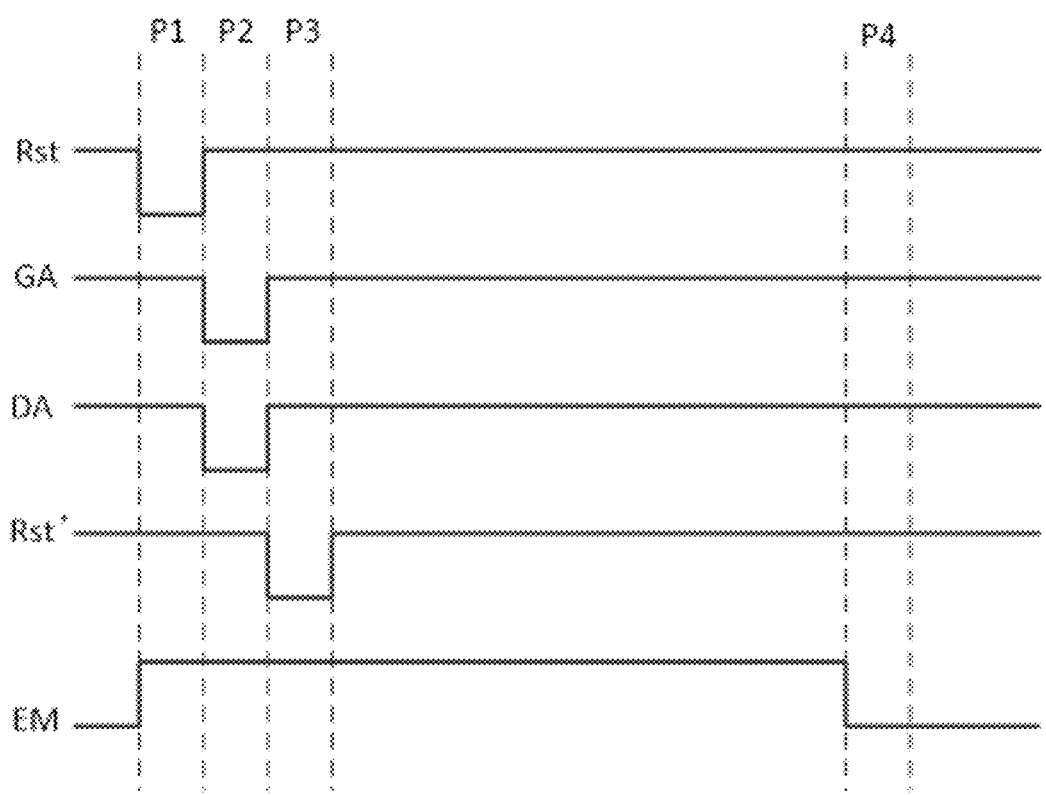
FIG. 2 is an operational timing diagram of a driving circuit provided in an embodiment of the present disclosure.
Figure 3:
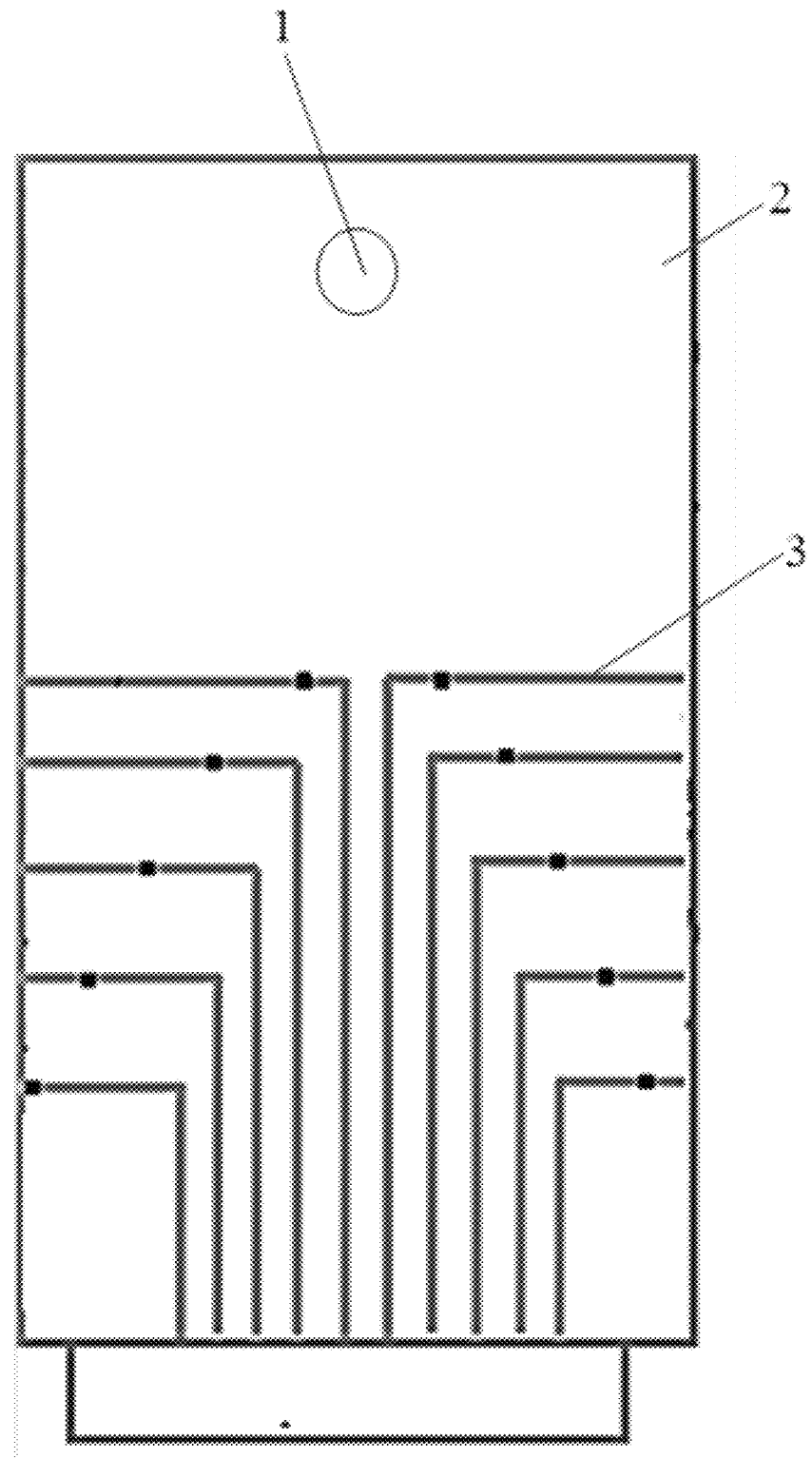
FIG. 3 is an overall structure diagram of a display substrate provided in an embodiment of the present disclosure.

As shown in FIG. 1 and FIG. 2, in some embodiments, the display substrate further includes multiple reset lines Rst, multiple data lines DA, multiple gate lines GA, multiple light-emitting control lines EM, multiple power supply lines VDD, multiple first initialization signal lines Vinit1, and multiple second initialization signal lines Vinit2.

The normal driving circuit 21 and the dummy driving circuit 22 both include a first reset transistor T1, a compensation transistor T2, a driving transistor T3, a data writing transistor T4, a power supply control transistor T5, a light-emitting control transistor T6, a second reset transistor T7, and a storage capacitor Cst.

A gate electrode of the first reset transistor T1 is coupled to a corresponding reset line Rst, a first electrode of the first reset transistor T1 is coupled to a corresponding first initialization signal line Vinit1, and a second electrode of the first reset transistor T1 is coupled to a gate electrode of the driving transistor T3.

A gate electrode of the compensation transistor T2 is coupled to a corresponding gate line GA, a first electrode of the compensation transistor T2 is coupled to a second electrode of the driving transistor T3, and a second electrode of the compensation transistor T2 is coupled to the gate electrode of the driving transistor T3.

A gate electrode of the data writing transistor T4 is coupled to a corresponding gate line GA, a first electrode of the data writing transistor T4 is coupled to a corresponding data line, and a second electrode of the data writing transistor T4 is coupled to a first electrode of the driving transistor T3.

A gate electrode of the power supply control transistor T5 is coupled to a corresponding light-emitting control signal line, a first electrode of the power supply control transistor T5 is coupled to a power supply line VDD, and a second electrode of the power supply control transistor T5 is coupled to the first electrode of the driving transistor T3.

A gate electrode of the light-emitting control transistor T6 is coupled to a corresponding light-emitting control signal line, a first electrode of the light-emitting control transistor T6 is coupled to a second electrode of the driving transistor T3, and a second electrode of the light-emitting control transistor T6 is coupled to a light-emitting element EL included in the sub-pixel; a cathode of the light-emitting element EL receives a negative power supply signal VSS.

A gate electrode of the second reset transistor T7 is coupled to a same reset line Rst' as a gate electrode of the first reset transistor T1 in the adjacent driving circuit along the second direction. A first electrode of the second reset transistor T7 is coupled to a corresponding second initialization signal line Vinit2, and a second electrode of the second reset transistor T7 is coupled to an anode of the light-emitting element EL. The second reset transistor T7 is used to reset the anode of the light-emitting element EL.

As shown in FIG. 1 and FIG. 2, when the pixel driving circuit of the above-mentioned structure is in operation, each operating cycle includes a first reset period P1, a writing compensation period P2, a second reset period P3, and a light-emitting period P4.

In the first reset period P1, the reset signal inputted by the reset line Rst is at an active level, the first reset transistor T1 is turned on, and the first initialization signal transmitted by the first initialization signal line Vinit1 is inputted to the gate electrode T3-$g$ of the driving transistor T3, so that the gate-source voltage Vgs held on the driving transistor T3 in the previous frame is cleared, thereby resetting the gate electrode T3-$g$ of the driving transistor T3.

During the writing compensation period P2, the reset signal is at a non-active level, the first reset transistor T1 is turned off, the gate scanning signal input by the gate line GA is at an active level, the compensation transistor T2 and the data writing transistor T4 are controlled to be turned on, the data line DA writes a data signal, and is transmitted to the first electrode of the driving transistor T3 by the data writing transistor T4; at the same time, the compensation transistor T2 and the data writing transistor T4 are turned on, so that the driving transistor T3 is formed as a diode structure, thus a threshold voltage compensation of the driving transistor T3 is realized by the cooperation of the compensation transistor T2, the driving transistor T3, and the data writing transistor T4. When the compensation time is long enough, the potential of the gate electrode T3-$g$ of the driving transistor T3 may be controlled to finally reach Vdata+Vth, where Vdata represents a data signal voltage value and Vth represents a threshold voltage of the driving transistor T3.

During the second reset period P3, the gate scanning signal is at a non-active level, the compensation transistor T2 and the data writing transistor T4 are both turned off, a reset signal input by a reset line Rst' coupled to the next adjacent row of sub-pixels is at an active level, the second reset transistor T7 is controlled to be turned on. An initialization signal input by the second initialization signal line Vinit2 is input to the anode of the light-emitting element EL, and the light-emitting element EL is controlled not to emit light. The cathode of the light-emitting element EL is connected to a negative power supply signal VSS.

During the light-emitting period P4, a light-emitting control signal written by the light-emitting control line EM is at an active level, and the power supply control transistor T5 and the light-emitting control transistor T6 are controlled to be turned on, so that a power supply signal transmitted by the power supply line VDD is input to the first electrode of the driving transistor T3; at the same time, since the gate electrode T3-$g$ of the driving transistor T3 is maintained at Vdata+Vth, the driving transistor T3 is turned on; a gate-source voltage corresponding to the driving transistor T3 is Vdata+Vth-VDD, where VDD is a voltage value corresponding to the power supply signal; the leakage current generated based on the gate-source voltage flows to the anode of the corresponding light-emitting element EL, and drives the corresponding light-emitting element EL to emit light.

Figure 14:
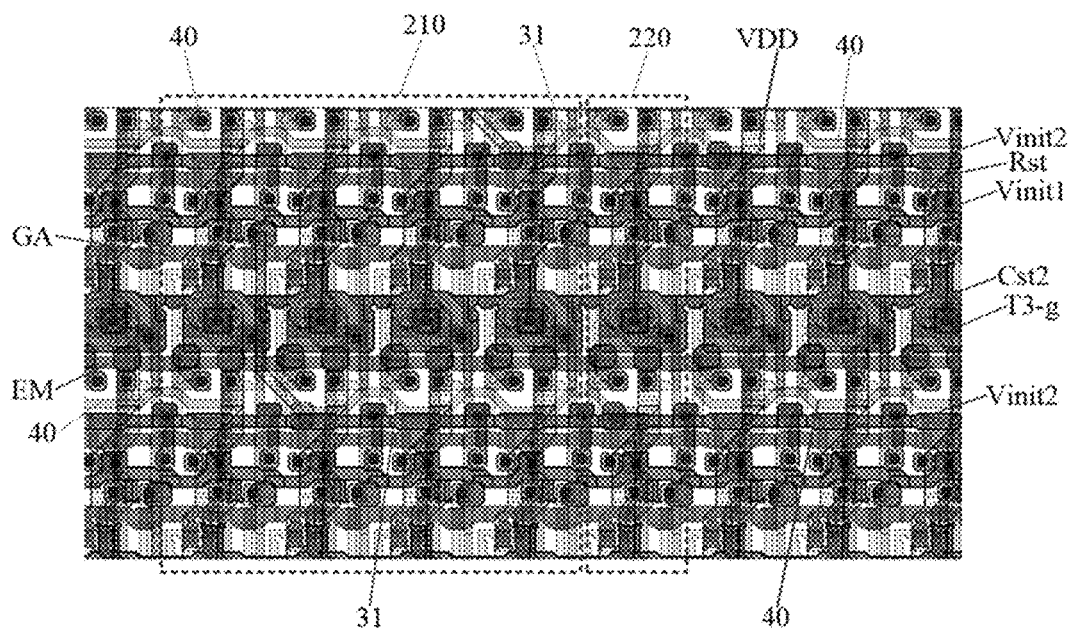
FIG. 14 is a first layout schematic diagram of a four-to-one scheme provided in an embodiment of the present disclosure.
Figure 15:
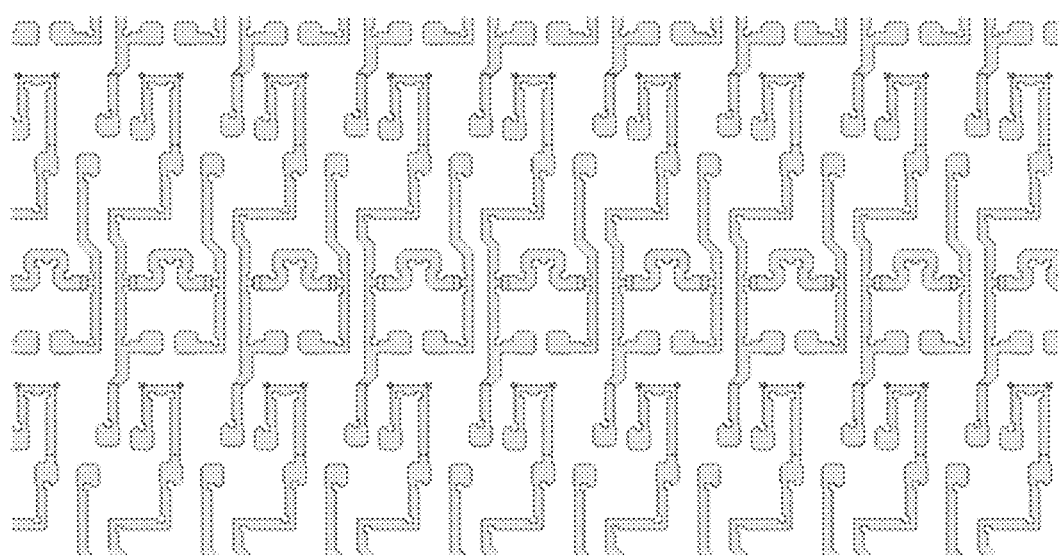
FIG. 15 is a layout schematic diagram of an active layer of FIG. 14.
Figure 16:
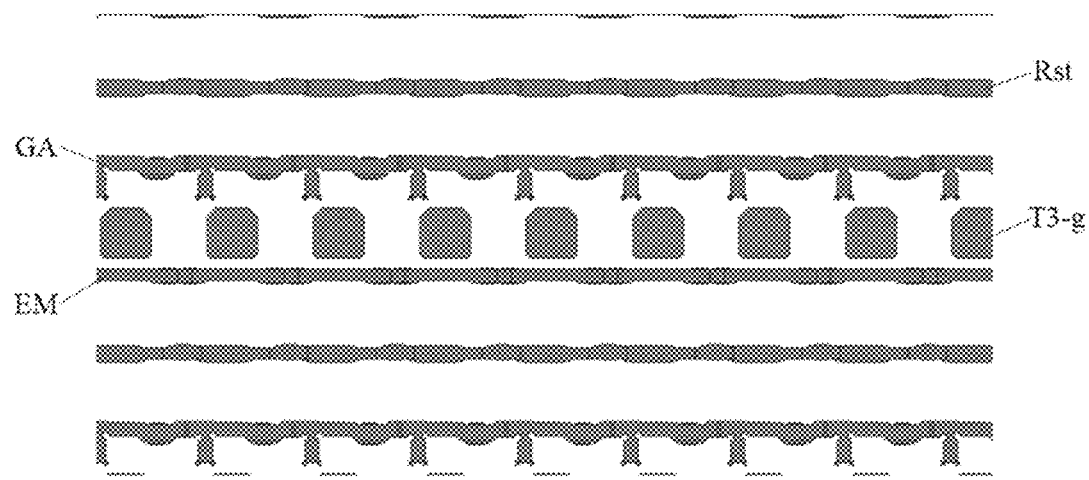
FIG. 16 is a layout schematic diagram of a first gate metal layer of FIG. 14.
Figure 17:
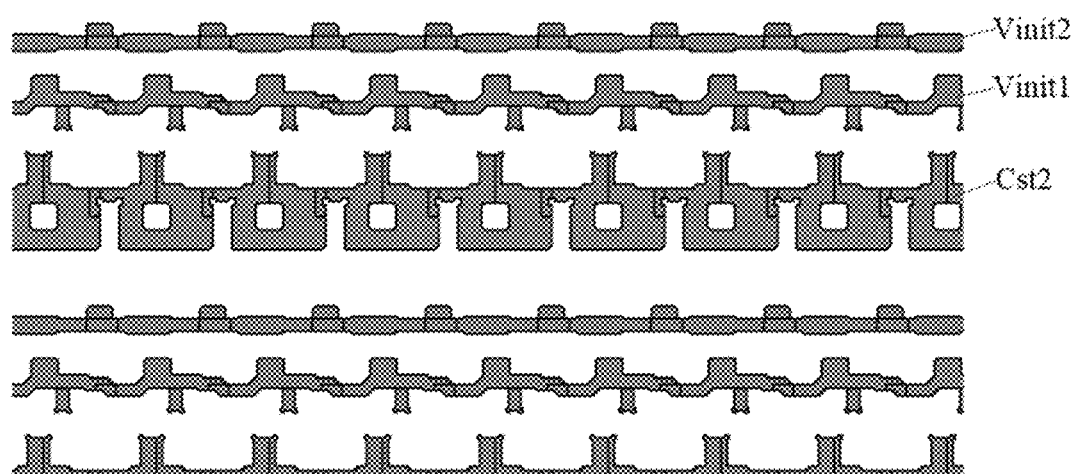
FIG. 17 is a layout schematic diagram of a second gate metal layer of FIG. 14.
Figure 22:
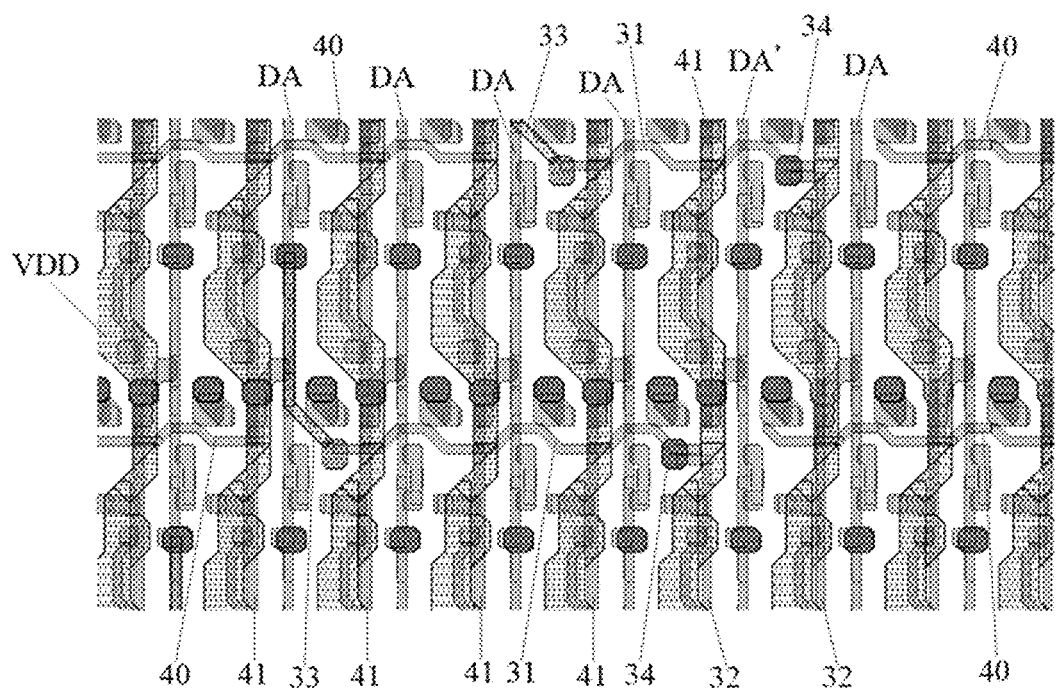
FIG. 22 is a layout schematic diagram of a first source-drain metal layer and an intermediate source-drain metal layer and a second source-drain metal layer of FIG. 14.
Figure 23:
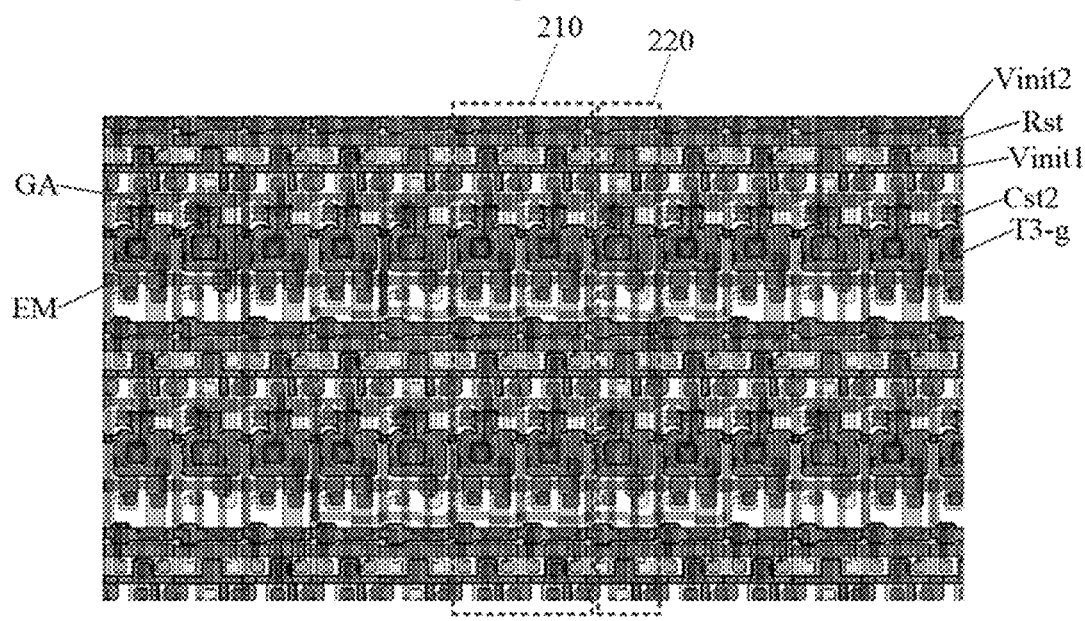
FIG. 23 is a first layout schematic diagram of a two-to-one scheme provided in an embodiment of the present disclosure.
Figure 24:
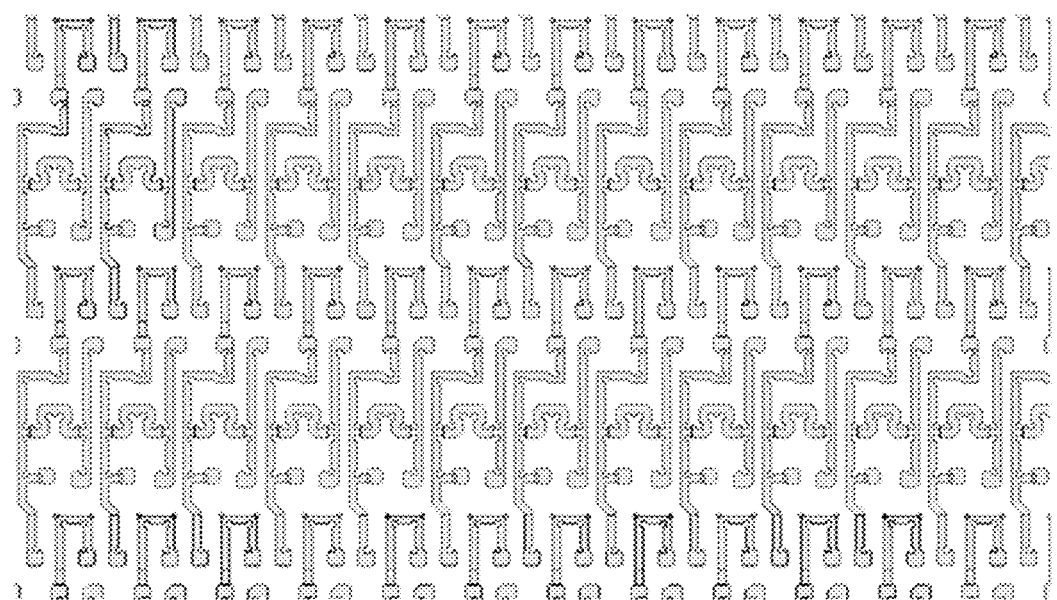
FIG. 24 is a layout schematic diagram of an active layer of FIG. 23.

As shown in FIGS. 3, 4, 5, 7 and FIG. 12 to FIG. 30, in some embodiments, referring to FIG. 22, the data lead 3 includes a first line segment 31 and a second line segment 32 coupled to each other, the first line segment 31 includes at least a portion extending along a first direction, the second line segment 32 includes at least a portion extending along a second direction, and the first direction intersects the second direction;

Referring to FIG. 14, the multiple dummy driving circuits 22 are divided into multiple dummy driving circuit columns 220, and each of the dummy driving circuit columns 220 includes multiple dummy driving circuits 22 arranged along the second direction.

Referring to FIG. 14 and FIG. 22, the first line segment 31 is coupled to the normal data line DA, and the second line segment 32 is coupled to the data signal input terminal; an orthographic projection of the second line segment 32 onto the base substrate at least partially overlaps with an orthographic projection of at least some of dummy driving circuits 22 included in a corresponding column of dummy driving circuits 22 onto the base substrate.

Illustratively, when the display substrate uses FDC technology, a pixel driving circuit compression scheme is specifically used, and this scheme enables the normal display area 2 to include multiple normal driving circuits 21 and multiple dummy driving circuits 22 by compressing the size of the pixel driving circuits. The multiple dummy driving circuits 22 may be divided into multiple dummy driving circuit columns 220, and the dummy driving circuit columns 220 are in a periodic layout, i.e., every few columns of the normal driving circuit columns will have one dummy driving circuit column 220. A portion of the dummy driving circuits 22 may be coupled to the light-emitting device located in the light-transmitting display area 1 by the conductive connection line, for driving the light-emitting device located in the light-transmitting display area 1 to display.

Illustratively, the first line segment 31 and the second line segment 32 are arranged in a same layer or in a different layer. When the first line segment 31 and the second line segment 32 are provided in a different layer, there is an insulating layer between the first line segment 31 and the second line segment 32, and the first line segment 31 and the second line segment 32 may be coupled by a via hole through the insulating layer. Alternatively, when the first line segment 31 and the second line segment 32 are provided in a different layer, the first line segment 31 and the second line segment 32 may be coupled by a conductive pattern of the other film layers.

Illustratively, the first direction includes a transverse direction and the second direction includes a longitudinal direction.

Illustratively, the display substrate further includes multiple light-emitting control lines EM, and the first line segment 31 extends in substantially the same direction as the light-emitting control line EM.

Illustratively, the first line segment 31 and the normal data line DA are provided in a different layer, there is an insulating layer between the first line segment 31 and the normal data line DA, and the first line segment 31 and the normal data line DA may be coupled by a via hole through the insulating layer. Alternatively, the first line segment 31 and the normal data line DA may be coupled by a conductive pattern of the other film layers.

In the display substrate provided by the above-mentioned embodiments, by arranging that the orthographic projection of the second line segment 32 onto the base substrate at least partially overlaps with the orthographic projection of at least a portion of the dummy driving circuits 22 included in a corresponding column of dummy driving circuits 22 onto the base substrate, all the second line segments 32 included in the data leads 3 can be laid out on the periodically occurring dummy driving circuit columns 220, and most of the loading generated by the data leads 3 is distributed in the layout region of the dummy driving circuit 22, so that the data leads 3 do not generate a large parasitic capacitance to a normal sub-pixel to which a normal driving circuit 21 belongs. Thus, the influence of the data lead 3 on the normal driving circuit 21 is effectively reduced, the function of the normal sub-pixel is better realized, and a more excellent display effect is realized.

As shown in FIGS. 18, 19, 20, and 22, in some embodiments, the data lead 3 is provided to further include a first conductive connection part 33 and a second conductive connection part 34; the first conductive connection part 33 is coupled to the first line segment 31 and the normal data line DA; and the second conductive connection part 34 is coupled to the first line segment 31 and the second line segment 32.

The above-mentioned arrangement can better ensure the reliability of the connection between the first line segment and the second line segment, and the reliability of the connection between the first line segment and the normal data line DA. Also, the layout difficulty of the data leads can be reduced.

Figure 27:
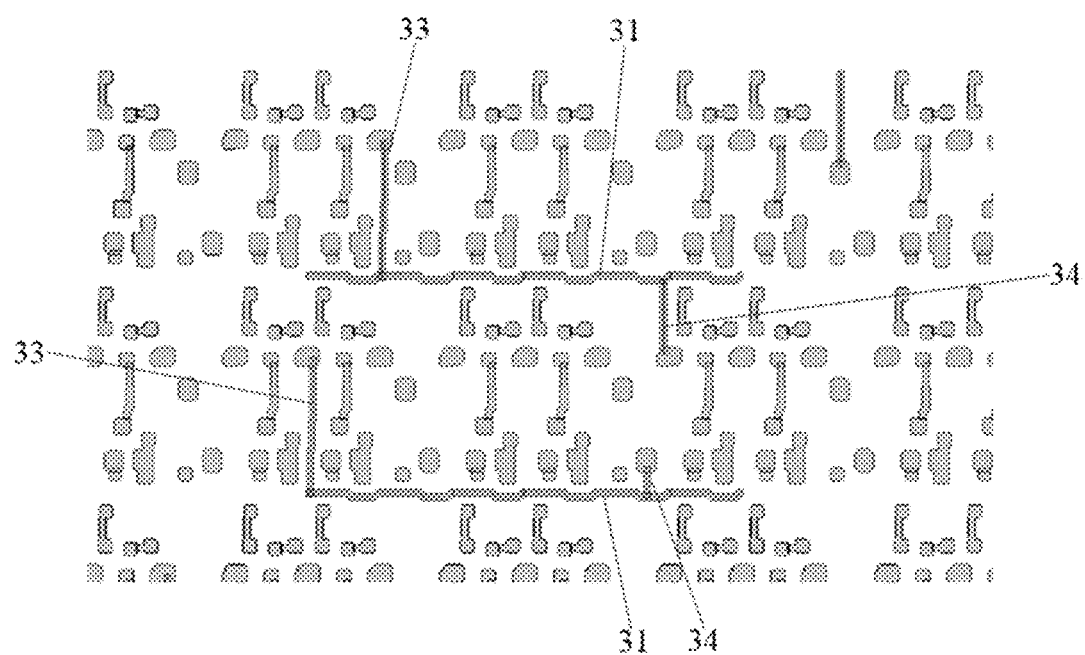
FIG. 27 is a layout schematic diagram of a first source-drain metal layer of FIG. 23.

As shown in FIG. 27, in some embodiments, the first conductive connection part 33 and the second conductive connection part 34 are formed in a integrate structure with the first line segment 31.

The above-mentioned arrangement does not need to add an additional switching pattern, which is advantageous for improving the transmittance of the display substrate.

Figure 19:
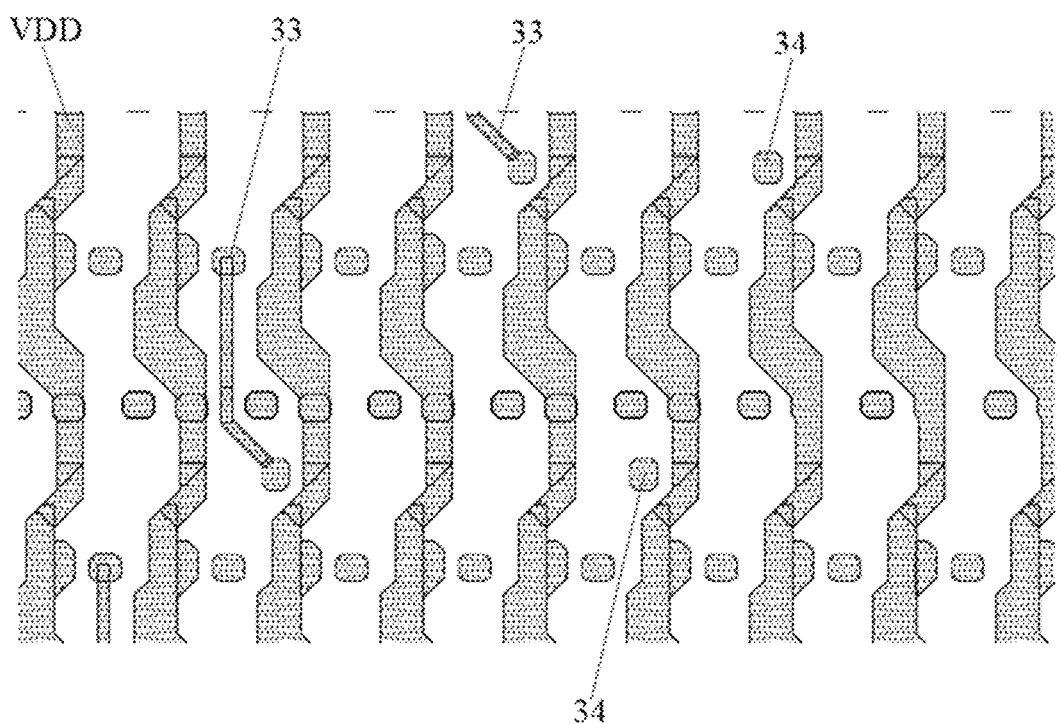
FIG. 19 is a layout schematic diagram of an intermediate source-drain metal layer of FIG. 14.

In some embodiments, as shown in FIG. 27, the first conductive connection part 33 includes at least a portion extending along the second direction and the second conductive connection part 34 includes at least a portion extending along the second direction; alternatively, as shown in FIG. 19, the first conductive connection part 33 includes at least a portion extending along the second direction, and the second conductive connection part 34 includes a block pattern.

Figure 25:
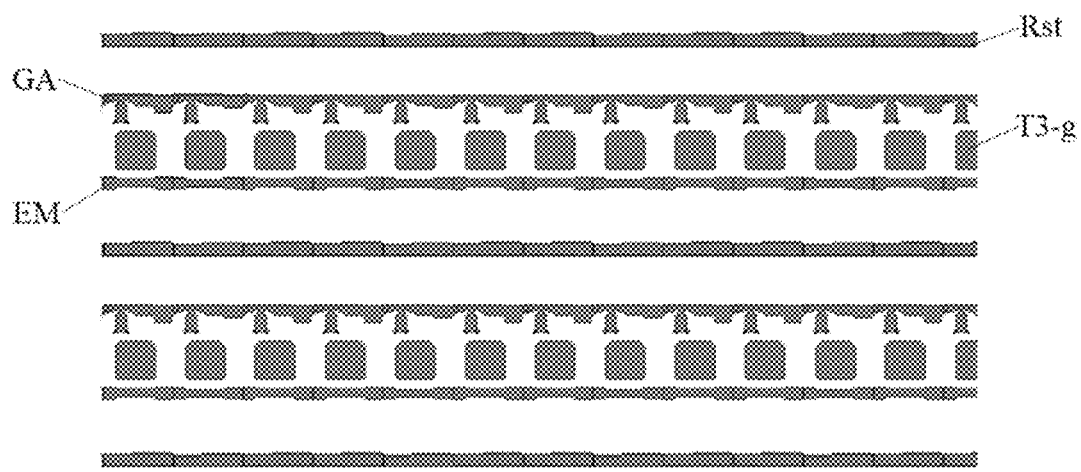
FIG. 25 is a layout schematic diagram of a first gate metal layer of FIG. 23.
Figure 26:
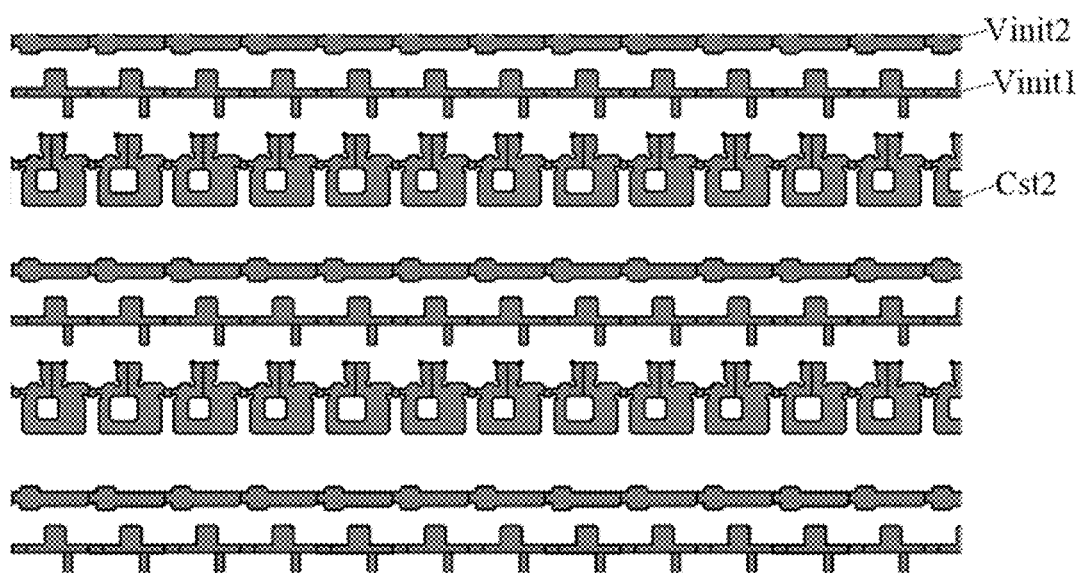
FIG. 26 is a layout schematic diagram of a second gate metal layer of FIG. 23.
Figure 29:
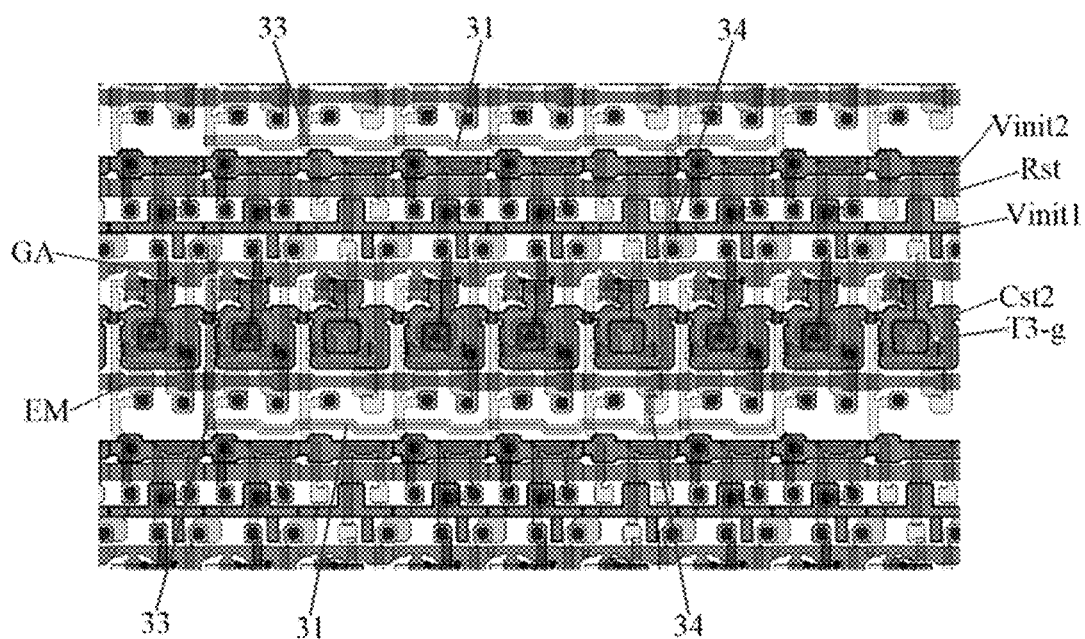
FIG. 29 is a layout schematic diagram of an active layer to a first source-drain metal layer of FIG. 23.
Figure 30:
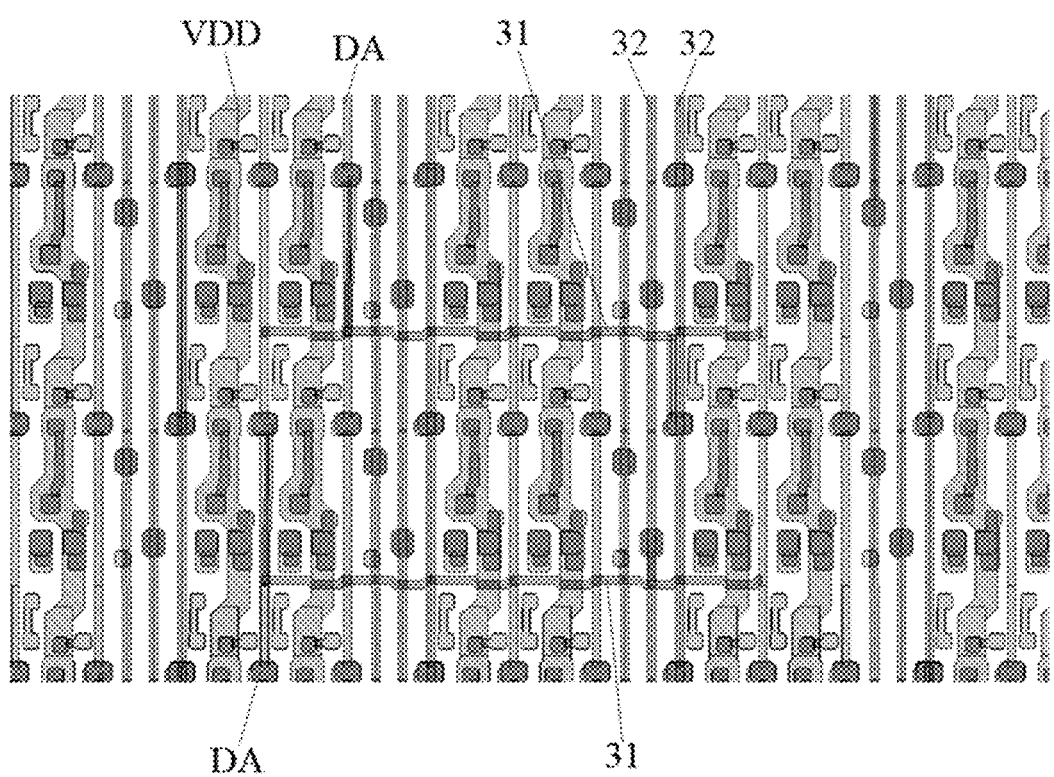
FIG. 30 is a layout schematic diagram of a first source-drain metal layer and a second source-drain metal layer of FIG. 14.

As shown in FIGS. 25, 27, and 29, in some embodiments, the normal driving circuit includes a driving transistor T3; the first conductive connection part 33 includes at least a portion extending along the second direction, and an orthographic projection of the first conductive connection part 33 onto the base substrate and an orthographic projection of a gate electrode T3-g of the driving transistor T3 onto the base substrate are arranged along the first direction.

Both the first conductive connection part 33 and the second conductive connection part 34 coupled to the first line segment 31 are located on a same side of the first line segment 31 along the second direction. Alternatively, both the first conductive connection part 33 and the second conductive connection part 34 coupled to the first line segment 31 are located on two opposite sides of the first line segment 31 along the second direction.

As shown in FIGS. 25, 27, and 29, in some embodiments, the display substrate further includes a gate line GA and a light-emitting control line EM, the orthographic projection of the first conductive connection part 33 onto the base substrate at least partially overlaps with an orthographic projection of the gate line GA onto the base substrate and an orthographic projection of the light-emitting control line EM onto the base substrate.

As shown in FIGS. 25, 27, and 29, in some embodiments, the display substrate further includes a first initialization signal line Vinit1, an orthographic projection of the second conductive connection part 34 onto the base substrate at least partially overlaps with an orthographic projection of the first initialization signal line Vinit1 onto the base substrate.

As shown in FIGS. 25, 27 and 29, in some embodiments, the display substrate further includes the light-emitting control line EM, the orthographic projection of the second conductive connection part 34 onto the base substrate at least partially overlaps with the orthographic projection of the light-emitting control line EM onto the base substrate.

The above-mentioned arrangement way reduces the layout difficulty of the display substrate while ensuring the connection performance of the normal data line DA, the first line segment 31, and the second line segment 32.

Figure 4:
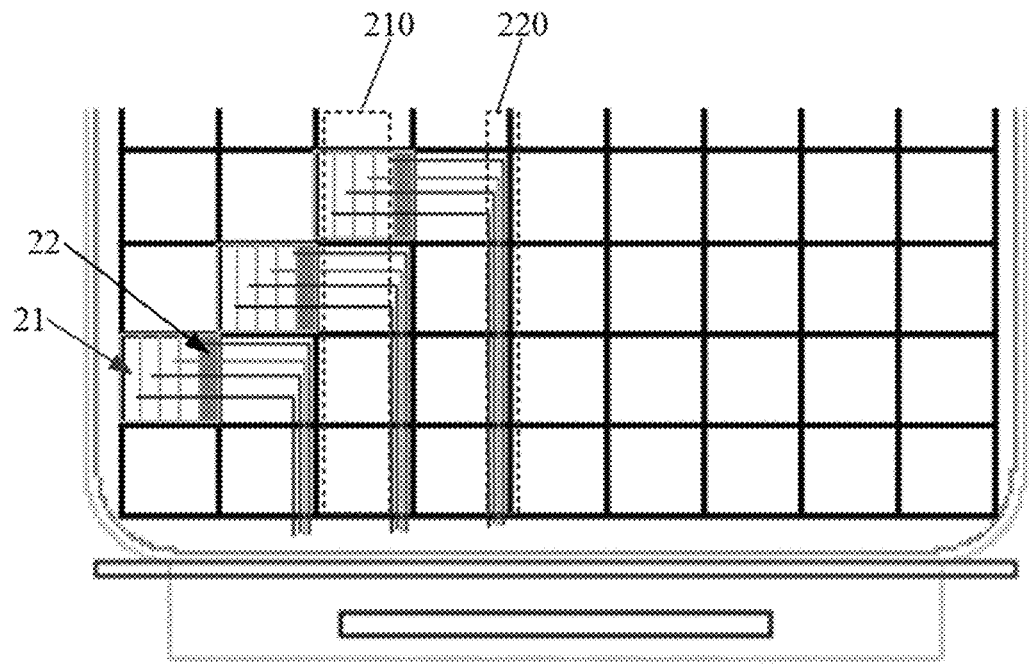
FIG. 4 is a first layout schematic diagram of a circuit group and a dummy driving circuit column provided in an embodiment of the present disclosure.
Figure 5:
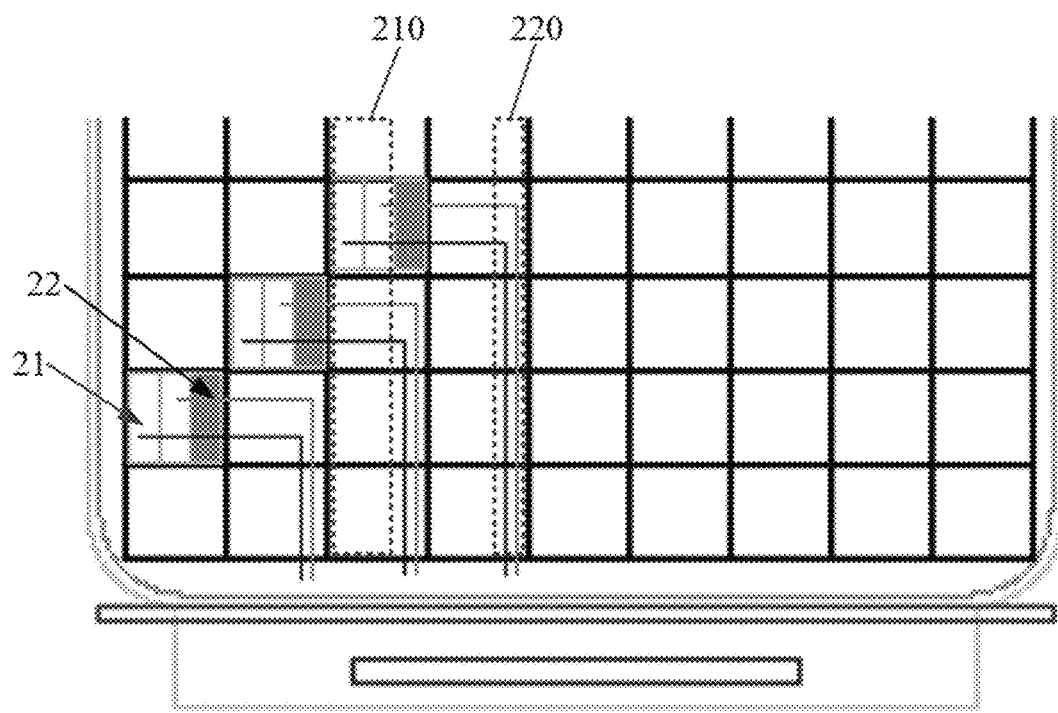
FIG. 5 is a second layout schematic diagram of a circuit group and a dummy driving circuit column provided in an embodiment of the present disclosure.

As shown in FIGS. 4 and 5, in some embodiments, the multiple normal driving circuits 21 are divided into multiple columns of normal driving circuits, each column of normal driving circuits includes multiple normal driving circuits 21 arranged along the second direction.

The multiple columns of normal driving circuits are divided into multiple circuit groups 210, and each circuit group 210 includes at least two columns of normal driving circuits; and the circuit group 210 and one dummy driving circuit column 220 are alternately arranged along the first direction.

It should be noted that only a portion of the normal driving circuits 21 and the dummy driving circuits 22 are shown in FIGS. 4 and 5 for the sake of clarity. In FIG. 4, each black box has a four-to-one structure (i.e., including four columns of normal driving circuits and one dummy driving circuit column), and in FIG. 5, each black box has a two-to-one structure (i.e., including two columns of normal driving circuits and one dummy driving circuit column).

Illustratively, the multiple circuit groups 210 are compressed to result in a layout space adjacent to each circuit group 210 within which to lay out the dummy driving circuit columns 220. After layout, the circuit group 210 and the dummy driving circuit column 220 are alternately arranged along the first direction.

As shown in FIGS. 4 and 5, in some embodiments, each circuit group 210 is provided to include two columns of normal driving circuits or four columns of normal driving circuits.

The above-mentioned arrangement way enables one dummy driving circuit column 220 to be laid out in every two columns of normal driving circuits at intervals; alternatively, one dummy driving circuit column 220 is laid out in every four columns of normal driving circuits at intervals.

As shown in FIGS. 4 and 5, in some embodiments, the multiple dummy driving circuits 22 include multiple first dummy driving circuits and multiple second dummy driving circuits, and the first dummy driving circuit is coupled to a light-emitting device located in the light-transmitting display area 1 via a connection line and used for driving the light-emitting device; and at least a portion of an orthographic projection of the second dummy driving circuit onto the base substrate partially overlaps with an orthographic projection of at least two second line segments 32 onto the base substrate.

Figure 32:
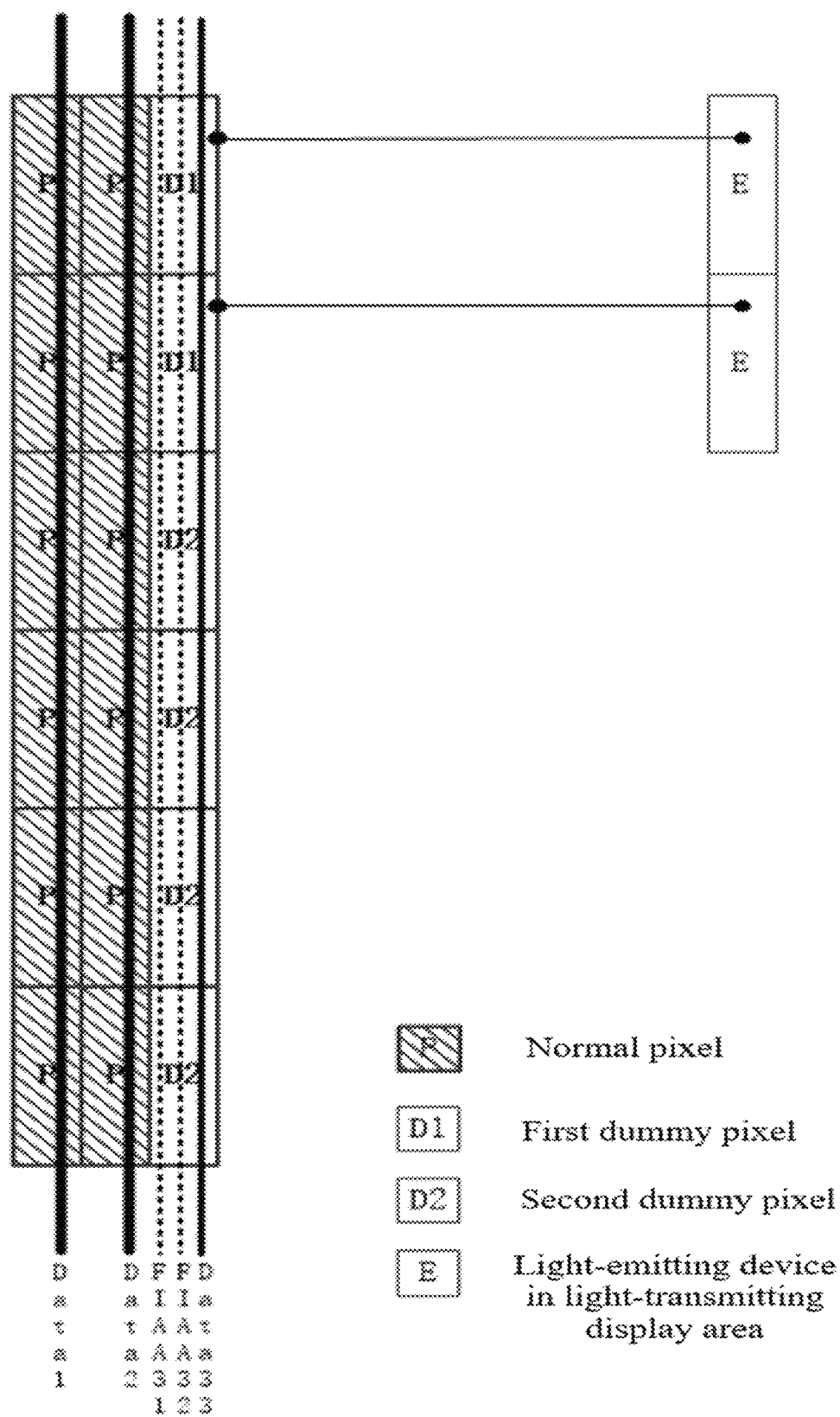
FIG. 32 is a schematic diagram of first dummy driving circuits for driving light-emitting devices located in a light-transmitting display area in a two-to-one scheme provided in an embodiment of the present disclosure.

FIG. 32 is a schematic diagram of a first dummy driving circuit for driving a light-emitting device E located in a light-transmitting display area 1 in the two-to-one scheme. Two columns of normal pixels P and one column of dummy pixels are illustrated in FIG. 32. The normal pixel P includes a normal driving circuit, and the dummy pixels include a first dummy pixel D1 and a second dummy pixel D2. The first dummy pixel D1 includes a first dummy driving circuit, and the first dummy driving circuit is coupled to the light-emitting device E located in the light-transmitting display area 1 through a connection line and is used for driving the light-emitting device E. The second dummy driving circuit is not coupled to the light-emitting device E located in the light-transmitting display area 1.

An orthographic projection of the normal driving circuits included in the first column of normal pixels onto the base substrate at least partially overlaps with an orthographic projection of a corresponding first normal data line Data1 onto the base substrate.

An orthographic projection of the normal driving circuits included in the second column of normal pixels onto the base substrate at least partially overlaps with an orthographic projection of a corresponding second normal data line Data2 onto the base substrate.

An orthographic projection of the dummy driving circuits included in the third column of dummy pixels onto the base substrate at least partially overlaps with an orthographic projection of a corresponding third dummy data line Data33 onto the base substrate, an orthographic projection of the first one FIAA31 of second line segments onto the base substrate, and an orthographic projection of the second one FIAA32 of the second line segments onto the base substrate.

Illustratively, in the two-to-one scheme provided by the embodiments of the present disclosure, an orthographic projection of the second line segment 32 onto the base substrate at least partially overlaps with an orthographic projection of the dummy driving circuit onto the base substrate.

Illustratively, the multiple first dummy driving circuits are located near the light-transmitting display area 1, and the multiple second dummy driving circuits are distributed throughout the normal display area 2.

Illustratively, the first dummy driving circuit is coupled to the light-emitting device located in the light-transmitting display area 1 by the connection line. The connection line includes at least a portion extending along the first direction, and the connection line includes a transparent connection line, which may be made of indium tin oxide (ITO), but is not limited thereto.

Illustratively, the orthographic projection of at least some of the second dummy driving circuits onto the base substrate at least partially overlaps with an orthographic projection of two second line segments 32 onto the base substrate; alternatively, the orthographic projection of at least some of the second dummy driving circuits onto the base substrate at least partially overlaps with the orthographic projection of four second line segments 32 onto the base substrate. The above-mentioned arrangement that one dummy driving circuit column 220 is laid out in every two columns of normal driving circuits at intervals; alternatively, one dummy driving circuit column 220 is laid out in every four columns of normal driving circuits at intervals. Thus, there are more dummy driving circuits near the light-transmitting display area 1, accordingly there are more first dummy driving circuits which can be selected near the light-transmitting display area 1, which avoids selecting a dummy driving circuit which is far away from the light-transmitting display area 1 as the first dummy driving circuit; and the distance between the light-emitting device in the light-transmitting display area 1 and the dummy driving circuit 22 correspondingly coupled thereto can be shorten, thereby shortening the length of the connection line. The capacitance generated by the connection line is reduced, and the difference between the light-transmitting display area 1 and the normal display area 2 is reduced; and a difference of the display brightness between the light-transmitting display area 1 and the normal display area 2 is reduced, the visual boundary of the under-screen display area is eliminated, and the display brightness uniformity of the display substrate is improved.

As shown in FIGS. 7 to 13 and FIG. 28, in some embodiments, the display substrate includes multiple power supply lines VDD and multiple normal data lines DA.

Figure 7:
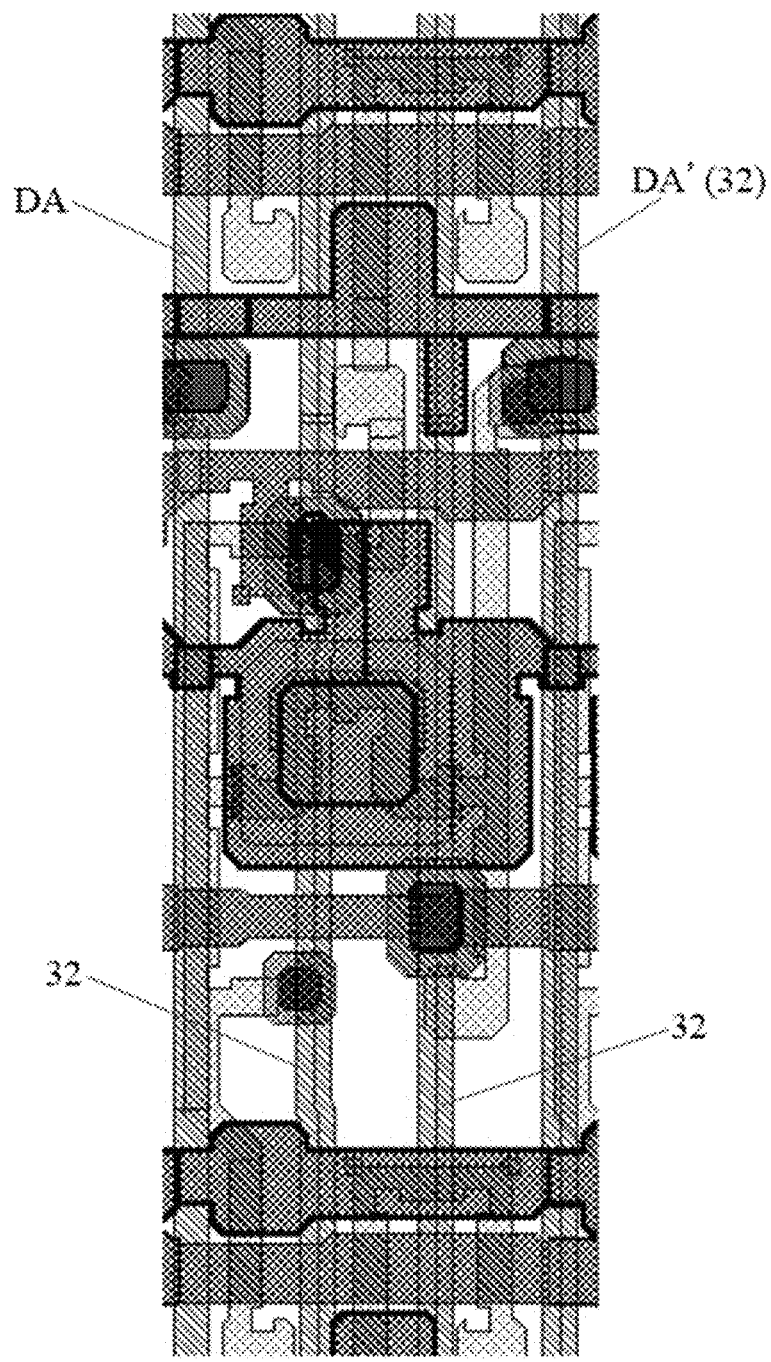
FIG. 7 is a first layout schematic diagram of a region where a dummy driving circuit is located provided in an embodiment of the present disclosure.
Figure 8:
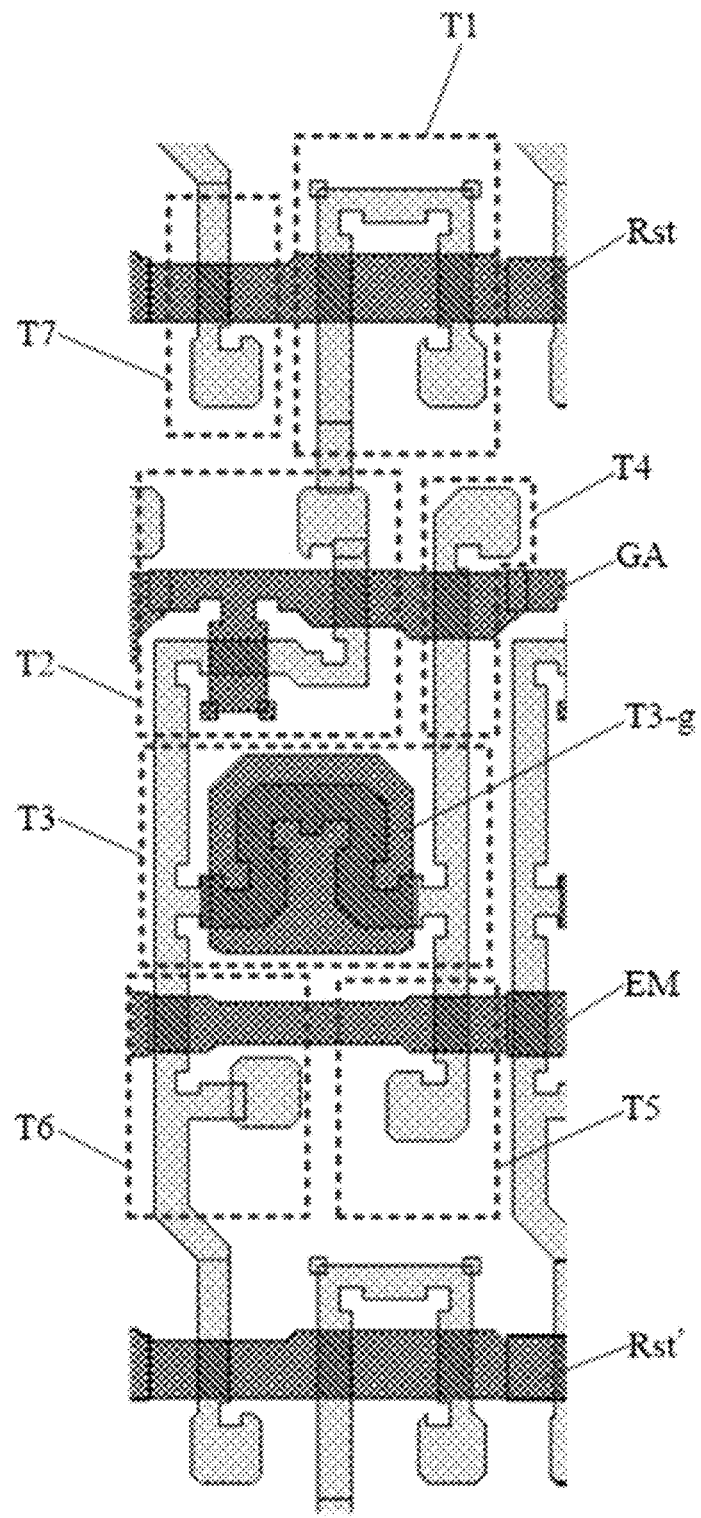
FIG. 8 is a layout schematic diagram of an active layer and a first gate metal layer of FIG. 7.
Figure 9:
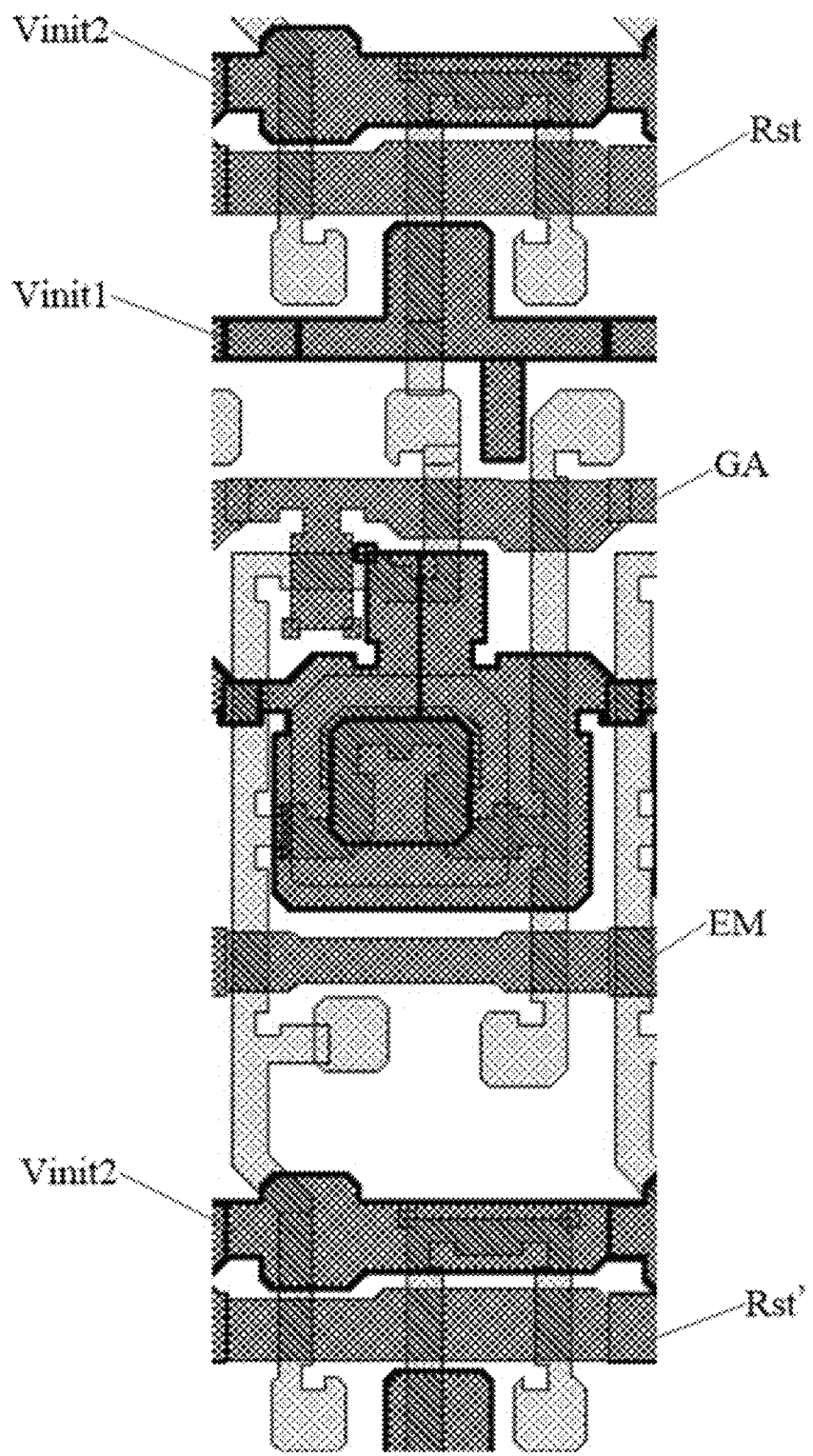
FIG. 9 is a layout schematic diagram of a second gate metal layer added on the basis of FIG. 8.
Figure 10:
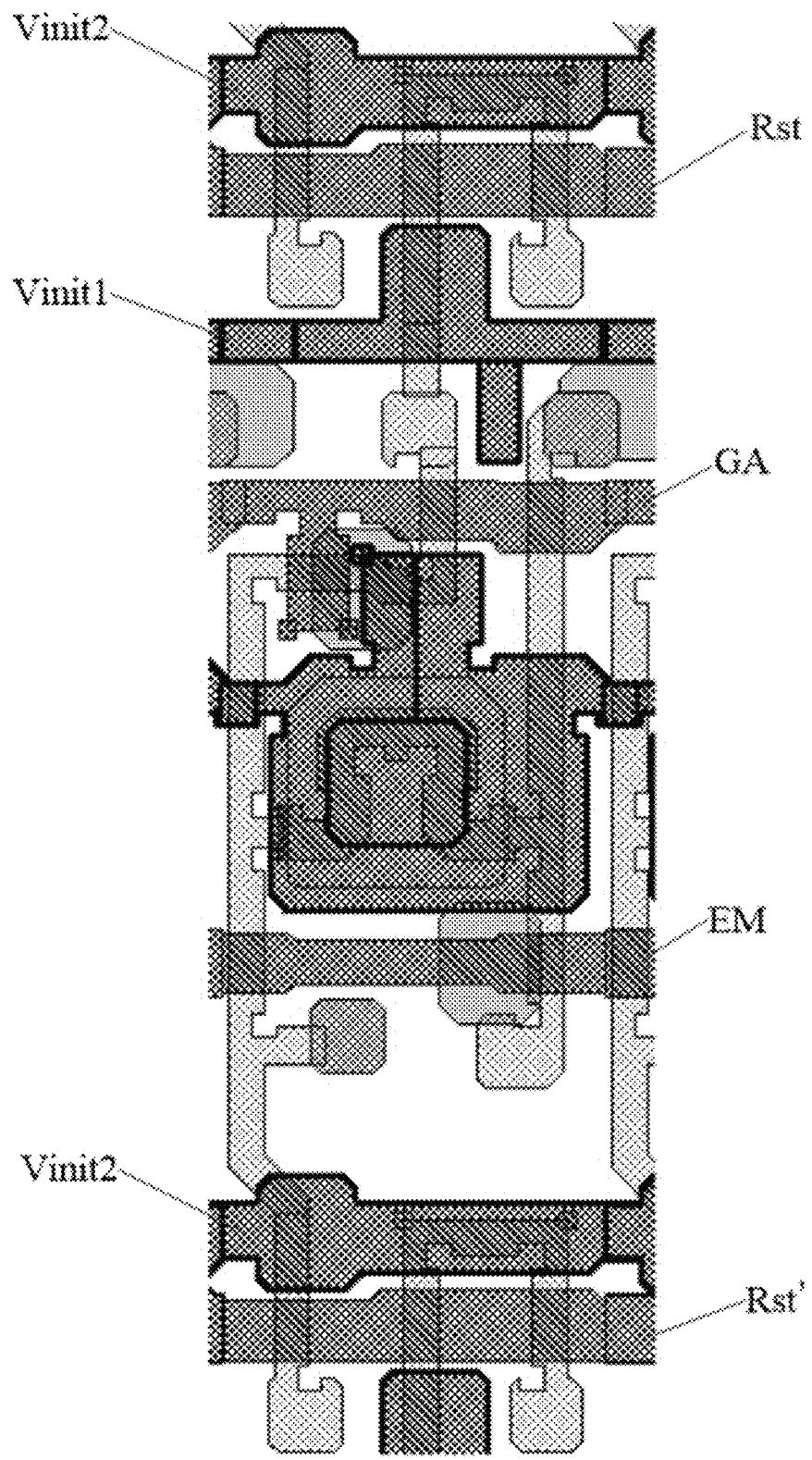
FIG. 10 is a layout schematic diagram of a first source-drain metal layer added on the basis of FIG. 9.
Figure 13:
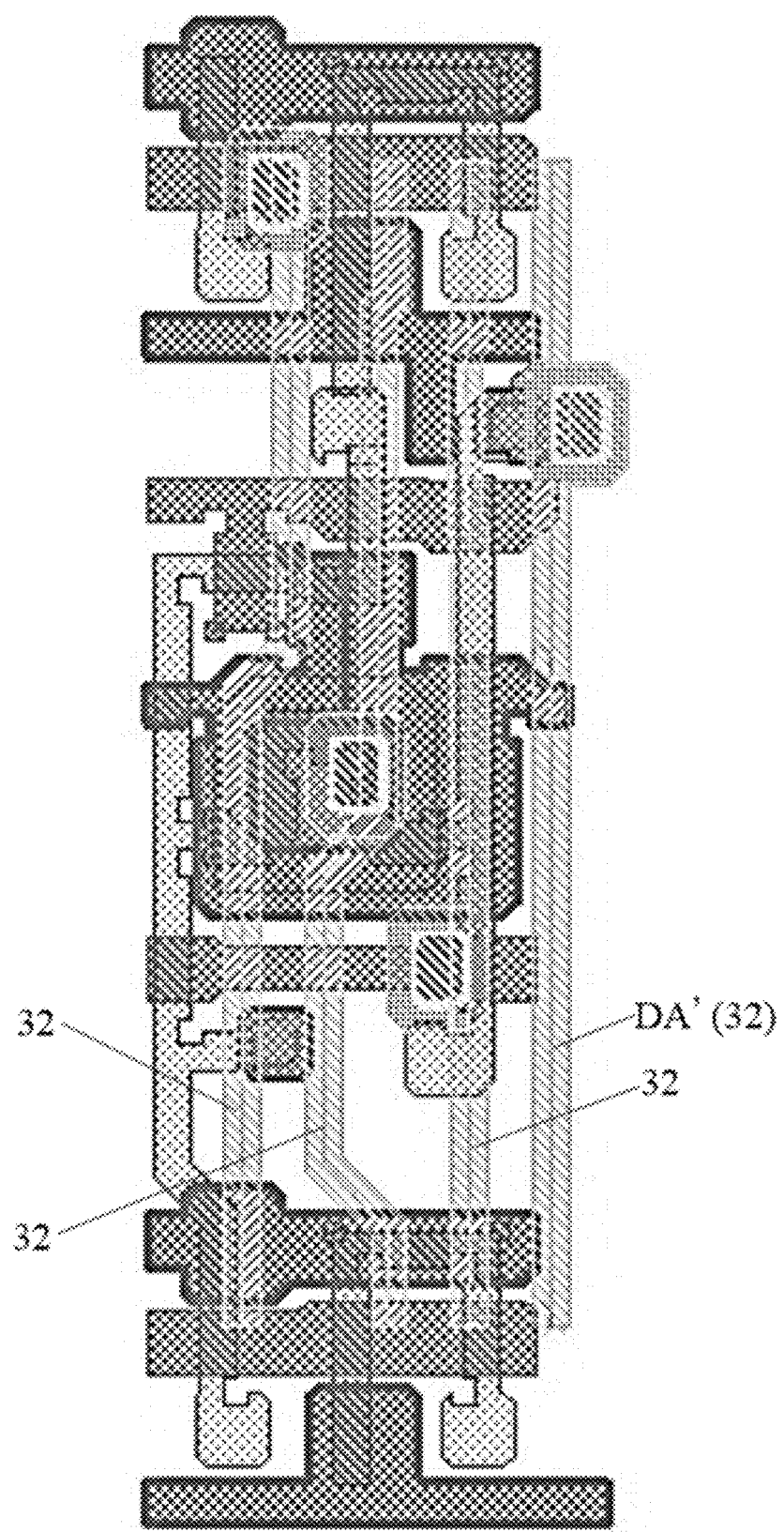
FIG. 13 is a second layout schematic diagram of a region where a dummy driving circuit is located provided in an embodiment of the present disclosure.

As shown in FIGS. 7 and 13, the orthographic projection of at least some of the second dummy driving circuits onto the base substrate does not overlap with the orthographic projection of the power supply line VDD onto the base substrate; and/or, as shown in FIG. 13, does not overlap with the orthographic projection of the normal data line DA onto the base substrate.

Figure 11:
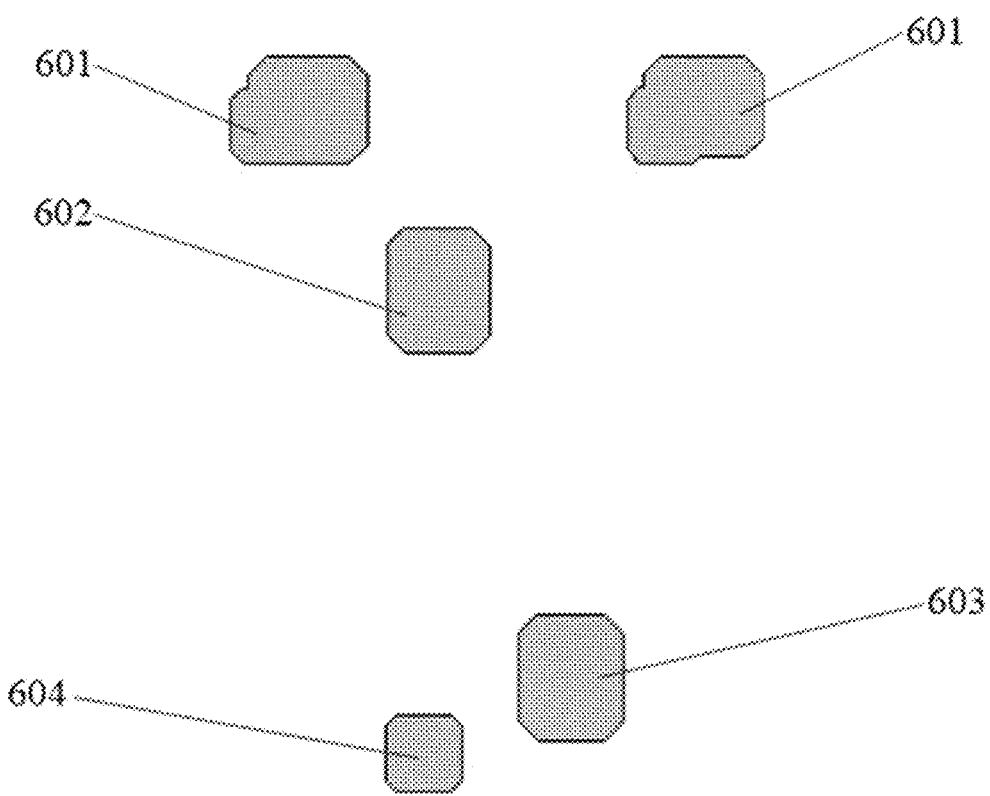
FIG. 11 is a layout schematic diagram of a first source-drain metal layer of FIG. 7.
Figure 12:
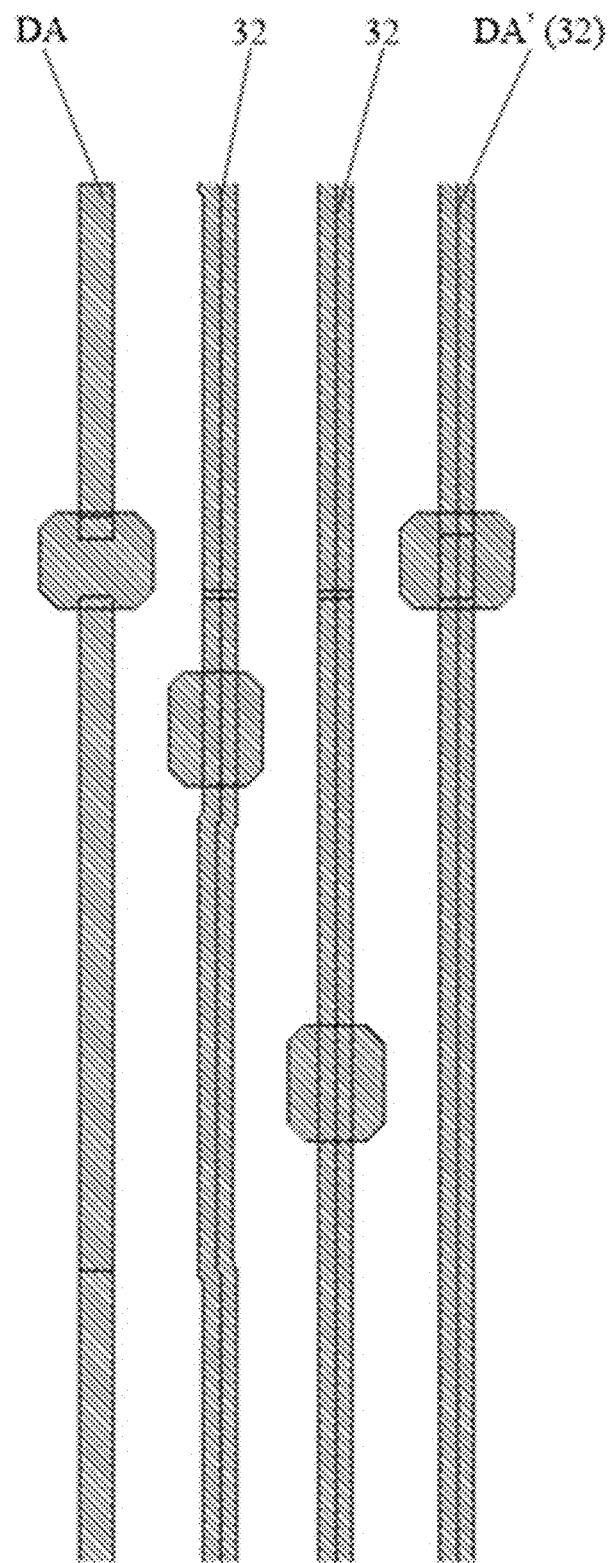
FIG. 12 is a layout schematic diagram of a second source-drain metal layer of FIG. 7.

It should be noted that a first conductive connection pattern 601, a second conductive connection pattern 602, a third conductive connection pattern 603, and a fourth conductive connection pattern 604 are illustrated in FIG. 11. The first conductive connection pattern 601 is used to connect the first electrode of the data writing transistor T4 and the corresponding normal data line DA (or the corresponding dummy data line DA'). The second conductive connection pattern 602 and the third conductive connection pattern 603 are used to connect the corresponding second line segment 32 and first line segment 31. The fourth conductive connection pattern 604 is used to connect the output end of the light-emitting control transistor T6 and the anode of the corresponding light-emitting device.

Illustratively, the multiple power supply lines VDD are arranged along the first direction, and the power supply line VDD includes at least a portion extending along the second direction. The multiple normal data lines DA are arranged along the first direction, and the normal data line DA includes at least a portion extending along the second direction.

The orthographic projection of at least some of the second dummy driving circuits onto the base substrate does not overlap with the orthographic projection of the power supply line VDD onto the base substrate, and/or does not overlap with the orthographic projection of the data line DA onto the base substrate. This portion of the orthographic projection of the second dummy driving circuits onto the base substrate at least partially overlaps with the orthographic projection of at least one second line segment 32 onto the base substrate. This arrangement way can reduce the parasitic capacitance formed between the second line segment 32 and the power supply line VDD and/or the rear data line DA, reduce the loading of the data lead 3 itself and the loading of the normal driving circuit 21, improve the display image quality of the display product, reduce the mura risk, and improve the competitiveness of the display product.

As shown in FIGS. 7, 12, 13, and 28, in some embodiments, the display substrate further includes multiple dummy data lines DA' coupled to the dummy driving circuits; it is arranged that the orthographic projection of at least some of the second dummy driving circuits onto the base substrate at least partially overlaps with an orthographic projection of three or four second line segments 32 onto the base substrate; and at least a portion of the dummy data lines DA' are reused as the second line segment 32.

The above-mentioned arrangement enables one second dummy driving circuit to overlap with more second line segments 32, which facilitates more second line segments 32 to overlap with the second dummy driving circuit located in the middle region, concentrating more second line segments 32 in the middle region of the display substrate, such that the second line segment 32 extend along the second direction downwards the lower frame of the display substrate in the vicinity of the middle region.

As shown in FIGS. 14 to 18, in some embodiments, the multiple normal driving circuits 21 and the multiple dummy driving circuits 22 are divided into multiple driving circuit rows; the multiple driving circuit rows include multiple first driving circuit rows and multiple second driving circuit rows;

an orthographic projection of the first line segment 31 onto the base substrate partially overlaps with an orthographic projection of a corresponding one of the first driving circuit rows onto the base substrate;

the display substrate further includes multiple first compensation lines 40; the first compensation line 40 includes at least a portion extending along the first direction; the first compensation line 40 and the first line segment 31 are provided in a same layer and made of a same material; an orthographic projection of a portion of the first compensation line 40 onto the base substrate at least partially overlaps with an orthographic projection of a corresponding one of the second driving circuit rows onto the base substrate; another portion of the first compensation line 40 and the first line segment 31 are arranged along the first direction.

Illustratively, the orthographic projection of the first line segment 31 onto the base substrate at least partially overlaps with the orthographic projection of the corresponding first driving circuit row onto the base substrate, and the orthographic projection of the first line segment 31 onto the base substrate does not overlap with the orthographic projection of the second driving circuit row onto the base substrate.

Illustratively, the multiple data leads 3 included in the display substrate may be substantially divided into two portions, and the two portions are symmetrically arranged. One portion is close to the left frame of the display substrate, and the other portion is close to the right frame of the display substrate. The multiple data leads 3 can extend from the left frame and the right frame of the display substrate to the vicinity of the middle region of the display substrate, and extend downwards the lower frame of the display substrate from the vicinity of the middle region.

Illustratively, the orthographic projection of the first compensation line 40 onto the base substrate at least partially overlaps with the orthographic projection of the corresponding second driving circuit row onto the base substrate, and the orthographic projection of the first compensation line 40 onto the base substrate partially overlaps with the orthographic projection of at least a portion of the first driving circuit row onto the base substrate.

Illustratively, one portion of the second driving circuit rows is located between the first driving circuit row and the lower frame of the display substrate, and the other portion of the second driving circuit rows is located between the first driving circuit row and the upper frame of the display substrate.

The first compensation lines 40 and the first line segments 31 included in the display substrate can be uniformly distributed throughout the normal display area 2, which facilitates improving the uniformity of the display substrate.

As shown in FIGS. 14 to 18, in some embodiments, the display substrate further includes multiple second initialization signal lines Vinit2 and multiple light-emitting control lines EM;

an orthographic projection of the first line segment 31 onto the base substrate is located between an orthographic projection of a second initialization signal line Vinit2 coupled to a first driving circuit row corresponding to the first line segment 31 onto the base substrate and an orthographic projection of a light-emitting control line EM coupled to the corresponding first driving circuit row onto the base substrate; and/or, the orthographic projection of a portion of the first compensation line 40 onto the base substrate is located between an orthographic projection of a second initialization signal line Vinit2 coupled to a second driving circuit row corresponding to the first compensation line 40 onto the base substrate and an orthographic projection of a light-emitting control line EM coupled to the corresponding second driving circuit row onto the base substrate.

Illustratively, the second initialization signal line Vinit2 and the light-emitting control line EM both include at least a portion extending along the first direction.

Since the layout space available between the orthographic projection of the second initialization signal line Vinit2 coupled to the first driving circuit row onto the base substrate and the orthographic projection of the light-emitting control line EM coupled to the first driving circuit row onto the base substrate is sufficient, the above-mentioned arrangement way is beneficial to reduce the parasitic capacitance generated between the first line segment 31 or the first compensation line 40 and other conductive structures, thereby greatly improving the display quality of the display substrate.

In some embodiments, the first compensation line 40 is provided to be coupled to a power supply line VDD in the display substrate.

Figure 18:
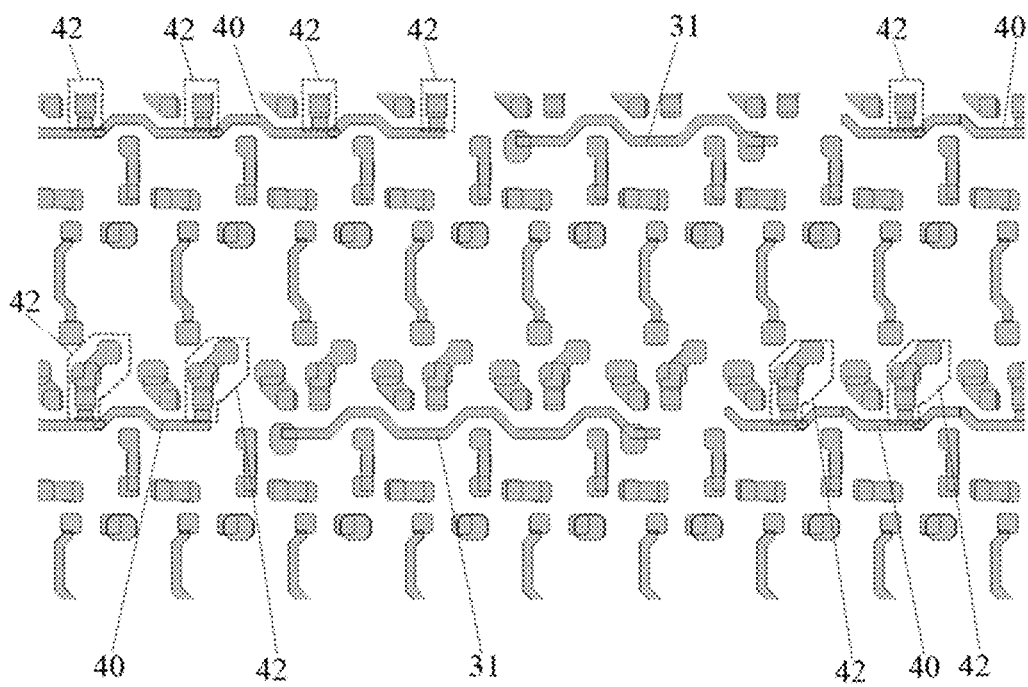
FIG. 18 is a layout schematic diagram of a first source-drain metal layer of FIG. 14.

In more detail, as shown in FIGS. 14, 18, and 19, the first compensation line 40 is coupled to a fifth conductive connection pattern 42. The orthographic projection of the fifth conductive connection pattern 42 onto the base substrate at least partially overlaps with the orthographic projection of the power supply line VDD onto the base substrate, and the fifth conductive connection pattern 42 is coupled to the power supply line VDD at the overlapping position by a via hole.

The power supply line VDD is used for transmitting a power supply signal with a stable potential. The above-mentioned arrangement that the first compensation line 40 is coupled to a power supply line VDD in the display substrate enables the first compensation line 40 not to be in a floating state while improving the uniformity of the display substrate, which facilitates improving the working stability of the display substrate.

Figure 20:
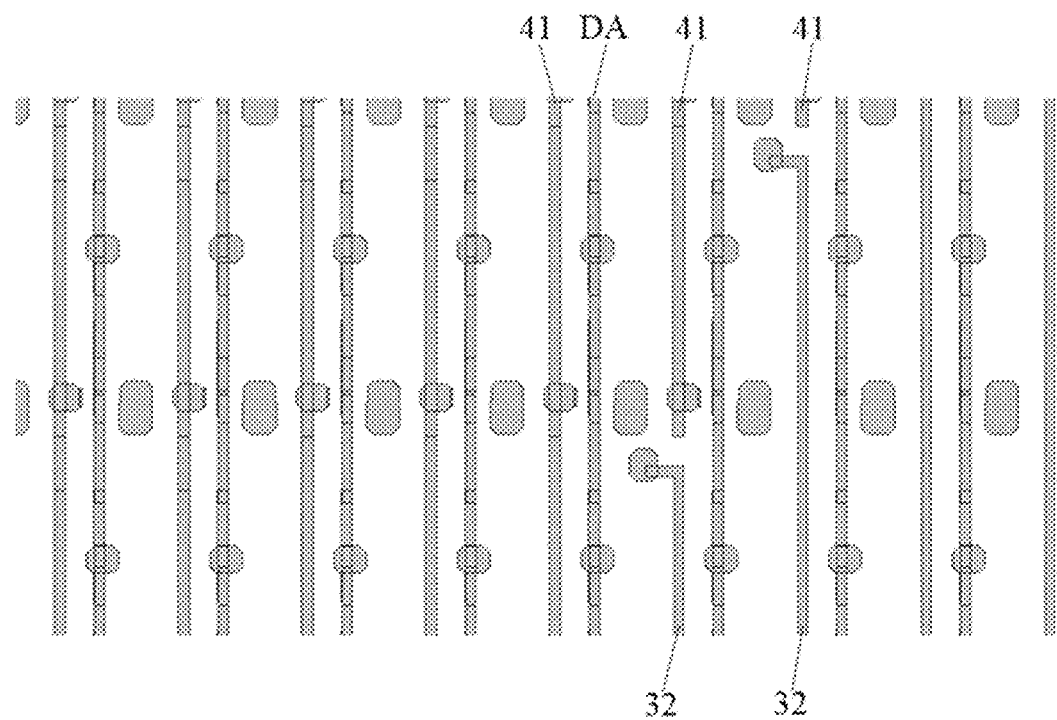
FIG. 20 is a layout schematic diagram of a second source-drain metal layer of FIG. 14.
Figure 21:
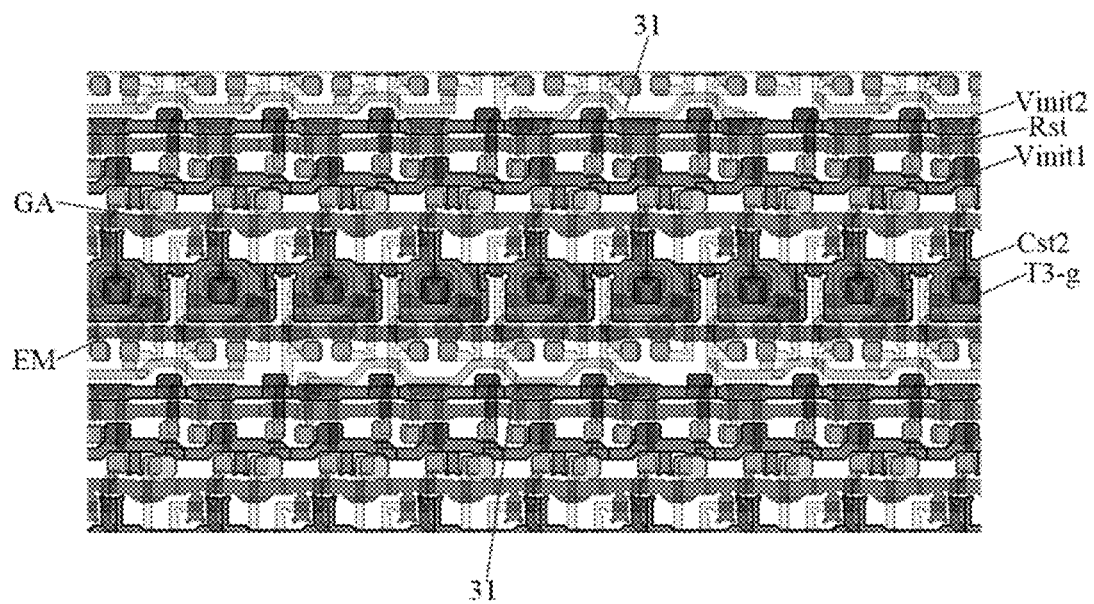
FIG. 21 is a layout schematic diagram of an active layer to a first source-drain metal layer of FIG. 14.

As shown in FIG. 20, in some embodiments, the display substrate further includes multiple second compensation lines 41; the second compensation line 41 includes at least a portion extending along the second direction; the second compensation line 41 and the second line segment 32 are provided in a same layer and made of a same material; an orthographic projection of a portion of the second compensation line 41 onto the base substrate at least partially overlaps with an orthographic projection of a corresponding column of normal driving circuits onto the base substrate. Another portion of the second compensation line 41 and the second line segment 32 are arranged along the second direction.

The above-mentioned arrangement that the display substrate further includes the second compensation line 41 enables the second compensation line 41 and the second line segment 32 to be uniformly distributed throughout the normal display area 2, which facilitates improving the uniformity of the display substrate.

As shown in FIGS. 18, 19, 22, 27, 28 and 30, in some embodiments, the display substrate includes a first source-drain metal layer SD1, a first planarization layer PLN1, and a second source-drain metal layer SD2 which are sequentially stacked along a direction away from the base substrate. The first line segment 31 is fabricated by using the first source-drain metal layer SD1, and the second line segment 32 is fabricated by using the second source-drain metal layer SD2.

Illustratively, the display substrate includes an active layer, a first gate insulating layer, a first gate metal layer, a second gate insulating layer, a second gate metal layer, an interlayer insulating layer, a first source-drain metal layer SD1, a passivation layer PVX, a first planarization layer PLN1, a second source-drain metal layer SD2, a second planarization layer PLN2, an anode layer, a pixel definition layer, a light-emitting functional layer, a cathode layer, and an encapsulation layer, which are sequentially stacked along a direction away from the base substrate.

Figure 28:
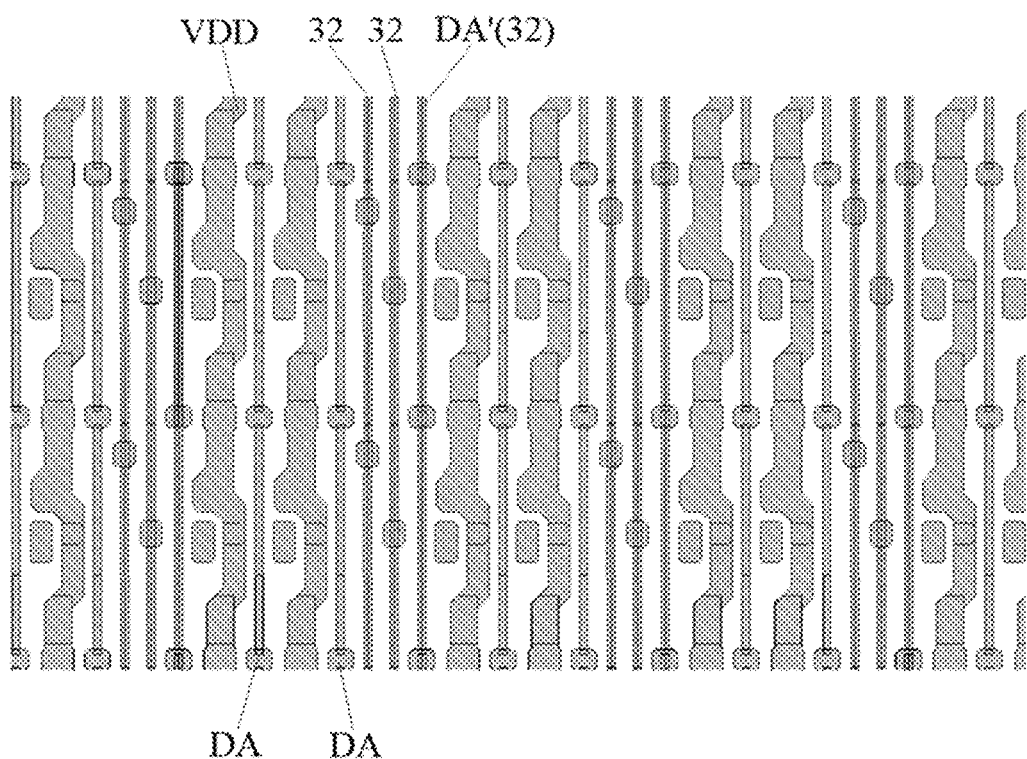
FIG. 28 is a layout schematic diagram of a second source-drain metal layer of FIG. 23.

Illustratively, as shown in FIG. 28, the normal data line DA and the dummy data line DA' are fabricated by using the second source-drain metal layer SD2. The power supply line VDD included in the display substrate is fabricated by using the second source-drain metal layer SD2.

The above-mentioned arrangement that the first line segment 31 is fabricated by using the first source-drain metal layer SD1 enables the first line segment 31 to be formed simultaneously with other conductive structures fabricated by using the first source-drain metal layer SD1 in the display substrate in the same patterning process, thereby avoiding adding an additional patterning process for fabricating the first line segment 31, effectively simplifying the fabrication process flow of the display substrate, and reducing the fabrication cost of the display substrate.

The above-mentioned arrangement that the second line segment 32 is fabricated by using the second source-drain metal layer SD2 enables the second line segment 32 to be formed simultaneously with other conductive structures fabricated by using the second source-drain metal layer SD2 in the display substrate in the same patterning process, thereby avoiding adding an additional patterning process for fabricating the second line segment 32, effectively simplifying the fabrication process flow of the display substrate, and reducing the fabrication cost of the display substrate.

Figure 6:
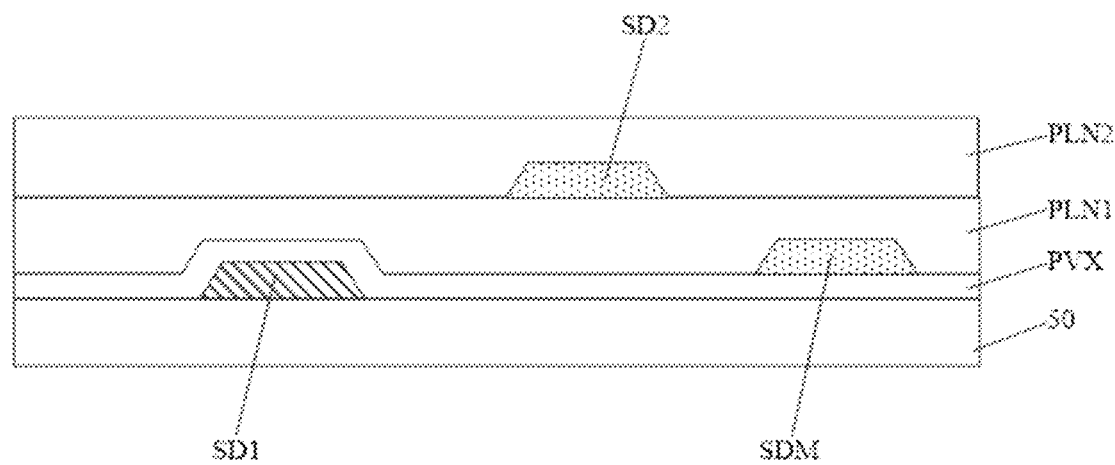
FIG. 6 is a layout schematic diagram of an intermediate source-drain metal layer provided in an embodiment of the present disclosure.

As shown in FIG. 6, in some embodiments, the display substrate includes a first source-drain metal layer SD1, a passivation layer PVX, an intermediate source-drain metal layer SDM, a first planarization layer PLN1, and a second source-drain metal layer SD2, which are sequentially stacked along a direction away from the base substrate.

An underlying film layer 50 located under the passivation layer PVX is also illustrated in FIG. 6.

Illustratively, the display substrate includes an active layer, a first gate insulating layer, a first gate metal layer, a second gate insulating layer, a second gate metal layer, an interlayer insulating layer, a first source-drain metal layer SD1, a passivation layer PVX, an intermediate source-drain metal layer SDM, a first planarization layer PLN1, a second source-drain metal layer SD2, a second planarization layer PLN2, an anode layer, a pixel definition layer, a light-emitting functional layer, a cathode layer, and an encapsulation layer, which are sequentially stacked along a direction away from the base substrate.

Illustratively, as shown in FIGS. 19 and 20, the normal data line DA is fabricated by using the second source-drain metal layer SD2. The power supply line VDD included in the display substrate is fabricated by using the intermediate source-drain metal layer SDM.

Since the layout space of a high-performance display substrate with a narrow frame is limited, the existing film layers may not be able to realize layout, and therefore an intermediate source-drain metal layer SDM may be added in the display substrate for the layout of some conductive structures. The above-mentioned layout of the intermediate source-drain metal layer SDM between the passivation layer PVX and the first planarization layer PLN1 enables a good avoidance of short-circuiting between the intermediate source-drain metal layer SDM and other adjacent conductive film layers without adding an additional insulating layer. Therefore, only one additional mask process is required to achieve the introduction of the intermediate source-drain metal layer SDM in the display substrate and ensure the reliability of the conductive structure fabricated by the intermediate source-drain metal layer SDM, which effectively saves the fabricating cost of the display substrate.

As shown in FIGS. 18, 19, 20, and 22, in some embodiments, the first line segment 31 is fabricated by using the first source-drain metal layer SD1, the second line segment 32 is fabricated by using the second source-drain metal layer SD2, and both the first conductive connection part 33 and the second conductive connection part 34 are fabricated by using the intermediate source-drain metal layer SDM.

The above-mentioned arrangement that the first line segment 31 is fabricated by using the first source-drain metal layer SD1 enables the first line segment 31 to be formed simultaneously with other conductive structures fabricated by using the first source-drain metal layer SD1 in the display substrate in the same patterning process, thereby avoiding adding an additional patterning process for fabricating the first line segment 31, effectively simplifying the fabrication process flow of the display substrate, and reducing the fabrication cost of the display substrate.

The above-mentioned arrangement that the second line segment 32 is fabricated by using the second source-drain metal layer SD2 enables the second line segment 32 to be formed simultaneously with other conductive structures fabricated by using the second source-drain metal layer SD2 in the display substrate in the same patterning process, thereby avoiding adding an additional patterning process for fabricating the second line segment 32, effectively simplifying the fabrication process flow of the display substrate, and reducing the fabrication cost of the display substrate.

The above-mentioned arrangement that the first conductive connection part 33 and the second conductive connection part 34 are both fabricated by using the intermediate source-drain metal layer SDM can effectively prevent the first conductive connection part 33 and the second conductive connection part 34 from short-circuiting with other conductive structures in the display substrate, not only reducing the layout difficulty of the display substrate, but also improving the reliability of the display substrate.

Embodiments of the present disclosure also provide a display device, including the display substrate provided in the above-mentioned embodiment. The display device further includes an encapsulation layer and a driving chip, in which the driving chip is coupled to the display substrate, and the encapsulation layer covers the display substrate.

It should be noted that the display device may be: any product or component with a display function, such as a television, a display, a digital photo frame, a mobile phone, a tablet computer, where the display device further includes a flexible circuit board, a printed circuit board, and a back plate.

In the display substrate provided in the above-mentioned embodiments, by arranging that a first end of the data lead 3 couples to a corresponding normal data line DA and a second end of the data lead 3 couples to a data signal input terminal, the data lead 3 can extend downwards from the vicinity of a middle region of the normal display area 2 to the lower frame of the display product, and couples to the data signal input terminal of the lower frame, thereby providing a data signal for the normal data line DA. Thus, even if the display substrate is used in a display product with a narrow frame, the data leads 3 can be well laid out in the lower frame.

In addition, in the display substrate provided by the embodiments of the present disclosure, by arranging that an orthographic projection of the data lead 3 onto the base substrate at least partially overlaps with an orthographic projection of the dummy driving circuit 22 onto the base substrate, at least a portion of the data lead 3 can be located in the layout region of the dummy driving circuit 22, and most of the loading generated by the data lead 3 is distributed in the layout region of the dummy driving circuit 22, so that the data lead 3 does not generate a large parasitic capacitance to a normal sub-pixel to which a normal driving circuit 21 belongs; thus, the influence of the data lead 3 on the normal driving circuit 21 is effectively reduced, the function of the normal sub-pixel is better realized, and a more excellent display effect is realized.

Furthermore, in the display substrate provided in the above-mentioned embodiments, the orthographic projection of at least some of the second dummy driving circuits onto the base substrate partially overlaps with an orthographic projection of two second line segments 32 onto the base substrate; alternatively, the orthographic projection of at least some of the second dummy driving circuits onto the base substrate partially overlaps with the orthographic projection of four second line segments 32 onto the base substrate. The above-mentioned arrangement that one dummy driving circuit column 220 is laid out in every two columns of normal driving circuits at intervals; alternatively, one dummy driving circuit column 220 is laid out in every four columns of normal driving circuits at intervals. Thus, there are more dummy driving circuits near the light-transmitting display area 1, accordingly there are more first dummy driving circuits which can be selected near the light-transmitting display area 1, which avoids selecting a dummy driving circuit which is far away from the light-transmitting display area 1 as the first dummy driving circuit; and the distance between the light-emitting device in the light-transmitting display area 1 and the dummy driving circuit 22 correspondingly coupled thereto can be shorten, thereby shortening the length of the connection line. The capacitance generated by the connection line is reduced, and the difference between the light-transmitting display area 1 and the normal display area 2 is reduced; and a difference of the display brightness between the light-transmitting display area 1 and the normal display area 2 is reduced, the visual boundary of the under-screen display area is eliminated, and the display brightness uniformity of the display substrate is improved.

The display device provided by the embodiments of the present disclosure also has the above-mentioned advantageous effects when including the above-mentioned display substrate, and will not be described in detail herein.

It should be noted that the signal line extending along the X direction means that: the signal line includes a main portion and a secondary portion connected to the main portion; the main portion is a line, a line segment, or a bar-shaped body; the main portion extends along the X direction, and the length of the main portion extending along the X direction is greater than the length of the secondary portion extending along other directions.

It should be noted that the "same layer" in the embodiments of the present disclosure may refer to a film layer on a same structural layer. Alternatively, for example, the film layers in the same layer may be a layer structure formed by a film layer for forming a specific pattern in a same film forming process and then patterning the film layer in one patterning process by using a same mask plate. Depending on different particular patterns, a single patterning process may include multiple exposure, development, or etching processes, and the particular patterns in the resulting layer structure may or may not be continuous. The particular patterns may also be at different heights or have different thicknesses.

In the various method embodiments of the present disclosure, the serial number of each step cannot be used to define the order of each step, and for those of ordinary skills in the art can change in the order of multiple steps, without involving any inventive effort, which shall also fall within the protection scope of the present disclosure.

It should be noted that the various embodiments described herein are described in a progressive manner with reference to the same or similar portions throughout the various embodiments, with each embodiment focusing on differences from the other embodiments. In particular, the method embodiments are described more simply because they are substantially similar to the product embodiments, with reference to a partial description of the product embodiments for relevant points.

Unless defined otherwise, technical or scientific terms used in the present disclosure shall have the ordinary meaning as understood by those of ordinary skills in the art to which the present disclosure belongs. Terms such as "first" and "second" used in the present disclosure does not denote any order, quantity, or importance, but rather is used to distinguish one element from another. Such words as "includes" or "comprise" mean that the presence of an element or item preceding the word covers the presence of the element or item listed after the word and equivalents thereof, but does not exclude other elements or items. The terms such as "connected", "coupled", or "linked" are not limited to physical or mechanical connections, but may include electrical connections, whether direct or indirect. The terms such as "upper", "lower", "left", "right" are used only to indicate relative positional relationships that may change accordingly when the absolute position of the object being described changes.

It will be understood that when an element such as a layer, film, region, or substrate is referred to as being "on" or "under" another element, it can be "directly on" or "directly under" the other element or intermediate elements may be present.

In the description of the above-mentioned embodiments, specific features, structures, materials, or characteristics may be combined in any suitable manner in any one or more embodiments or examples.

The foregoing embodiments are directed to specific implementations of the present disclosure, but the protection scope of the present disclosure is not limited thereto. Within the technical scope disclosed in the present disclosure, variations or substitutions that can easily be thought by any person skilled in the art shall fall within the protection scope of the present disclosure. Therefore, the protection scope of the present disclosure shall be subject to the protection scope of the claims in question.

What is claimed is:

1. A display substrate, comprising a base substrate, and a driving circuit layer and a light-emitting device layer located on the base substrate, wherein
    the display substrate comprises a light-transmitting display area and a normal display area, the normal display area surrounds at least a portion of the light-transmitting display area; the normal display area comprises a plurality of normal driving circuits and a plurality of dummy driving circuits; some of the dummy driving circuits are configured to drive light-emitting devices located in the light-transmitting display area;
    the display substrate further comprises a plurality of normal data lines coupled to the normal driving circuits; wherein at least one of the normal data lines is coupled to a data signal input terminal through a data lead; an orthographic projection of at least a portion of the data lead onto the base substrate at least partially overlaps with an orthographic projection of the dummy driving circuits onto the base substrate;
    the data lead comprises a first line segment and a second line segment coupled to each other, the first line segment comprises at least a portion extending along a first direction, the second line segment comprises at least a portion extending along a second direction, and the first direction intersects the second direction;
    the plurality of dummy driving circuits is divided into a plurality of columns of dummy driving circuits, and each column of dummy driving circuits comprises a plurality of dummy driving circuits arranged along the second direction; and
    the first line segment is coupled to the normal data line, and the second line segment is coupled to the data signal input terminal; an orthographic projection of the second line segment onto the base substrate at least partially overlaps with an orthographic projection of at least some of dummy driving circuits comprised in a corresponding column of dummy driving circuits onto the base substrate.

2. The display substrate according to claim 1, wherein the data lead further comprises a first conductive connection part and a second conductive connection part;
    the first conductive connection part is coupled to the first line segment and the normal data line; and
    the second conductive connection part is coupled to the first line segment and the second line segment.

3. The display substrate according to claim 2, wherein each of the first conductive connection part and the second conductive connection part is formed in an integrate structure with the first line segment.

4. The display substrate according to claim 2, wherein the normal driving circuit comprises a driving transistor; the first conductive connection part comprises at least a portion extending along the second direction, and an orthographic projection of the first conductive connection part onto the base substrate and an orthographic projection of a gate electrode of the driving transistor onto the base substrate are arranged along the first direction; and
    the first conductive connection part and the second conductive connection part that are coupled to the first line segment are located on a same side of the first line segment along the second direction; or, the first conductive connection part and the second conductive connection part that are coupled to the first line segment are located on two opposite sides of the first line segment along the second direction.

5. The display substrate according to claim 4, wherein the display substrate further comprises a gate line and a light-emitting control line, the orthographic projection of the first conductive connection part onto the base substrate at least partially overlaps with an orthographic projection of the gate line onto the base substrate and an orthographic projection of the light-emitting control line onto the base substrate.

6. The display substrate according to claim 4, wherein the display substrate further comprises a first initialization signal line, and an orthographic projection of the second conductive connection part onto the base substrate at least partially overlaps with an orthographic projection of the first initialization signal line onto the base substrate.

7. The display substrate according to claim 4, wherein the display substrate further comprises a light-emitting control line, and an orthographic projection of the second conductive connection part onto the base substrate at least partially overlaps with an orthographic projection of the light-emitting control line onto the base substrate.

8. The display substrate according to claim 1, wherein the plurality of normal driving circuits is divided into a plurality of columns of normal driving circuits, each column of normal driving circuits comprises a plurality of normal driving circuits arranged along the second direction; and
    the plurality of columns of normal driving circuits are divided into a plurality of circuit groups, and each of the circuit groups comprises at least two columns of normal driving circuits; and the circuit group and a column of dummy driving circuits are alternately arranged along the first direction.

9. The display substrate according to claim 8, wherein each of the circuit groups comprises two columns of normal driving circuits or four columns of normal driving circuits.

10. The display substrate according to claim 1, wherein the plurality of dummy driving circuits comprises a plurality of first dummy driving circuits and a plurality of second dummy driving circuits, and the first dummy driving circuit is coupled to one of the light-emitting devices located in the light-transmitting display area through a connection line, and configured to drive the light-emitting device; and
    an orthographic projection of at least some of the second dummy driving circuits onto the base substrate partially overlaps with an orthographic projection of at least two of the second line segments onto the base substrate.

11. The display substrate according to claim 10, wherein the display substrate further comprises a plurality of power supply lines and a plurality of normal data lines; and
    the orthographic projection of at least some of the second dummy driving circuits onto the base substrate does not overlap with an orthographic projection of the power supply lines onto the base substrate.

12. The display substrate according to claim 10, wherein the display substrate further comprises a plurality of dummy data lines coupled to the dummy driving circuits; and
the orthographic projection of at least some of the second dummy driving circuits onto the base substrate partially overlaps with an orthographic projection of three or four of the second line segments onto the base substrate; and at least a portion of the dummy data lines is reused as the second line segment.

13. The display substrate according to claim 8, wherein the plurality of normal driving circuits and the plurality of dummy driving circuits is divided into a plurality of driving circuit rows; the plurality of driving circuit rows comprises a plurality of first driving circuit rows and a plurality of second driving circuit rows;
an orthographic projection of the first line segment onto the base substrate partially overlaps with an orthographic projection of a corresponding one of the first driving circuit rows onto the base substrate; and
the display substrate further comprises a plurality of first compensation lines; the first compensation line comprises at least a portion extending along the first direction; the first compensation line and the first line segment are provided in a same layer and made of a same material; an orthographic projection of a portion of the first compensation line onto the base substrate at least partially overlaps with an orthographic projection of a corresponding one of the second driving circuit rows onto the base substrate; and another portion of the first compensation line and the first line segment are arranged along the first direction.

14. The display substrate according to claim 13, wherein the display substrate further comprises a plurality of second initialization signal lines and a plurality of light-emitting control lines;
the orthographic projection of the first line segment onto the base substrate is located between an orthographic projection of one of the second initialization signal lines coupled to one of the first driving circuit rows corresponding to the first line segment onto the base substrate, and an orthographic projection of one of the light-emitting control lines coupled to one of the first driving circuit rows corresponding to the first line segment onto the base substrate; and/or,
the orthographic projection of a portion of the first compensation line onto the base substrate is located between an orthographic projection of one of the second initialization signal lines coupled to one of the second driving circuit rows corresponding to the first compensation line onto the base substrate, and an orthographic projection of one of the light-emitting control lines coupled to one of the second driving circuit rows corresponding to the first compensation line onto the base substrate.

15. The display substrate according to claim 13, wherein the first compensation line is coupled to one of the power supply lines in the display substrate.

16. The display substrate according to claim 8, wherein the display substrate further comprises a plurality of second compensation lines; the second compensation line comprises at least a portion extending along the second direction; the second compensation line and the second line segment are provided in a same layer and made of a same material; an orthographic projection of a portion of the second compensation line onto the base substrate at least partially overlaps with an orthographic projection of a corresponding column of the normal driving circuits onto the base substrate; and another portion of the second compensation line and the second line segment are arranged along the second direction.

17. The display substrate according to claim 3, wherein the display substrate comprises a first source-drain metal layer, a first planarization layer, and a second source-drain metal layer that are sequentially stacked along a direction away from the base substrate; and
the first line segment is fabricated by using the first source-drain metal layer, and the second line segment is fabricated by using the second source-drain metal layer.

18. The display substrate according to claim 2, wherein the display substrate comprises a first source-drain metal layer, a passivation layer, an intermediate source-drain metal layer, a first planarization layer, and a second source-drain metal layer that are sequentially stacked along a direction away from the base substrate; and
the first line segment is fabricated by using the first source-drain metal layer, the second line segment is fabricated by using the second source-drain metal layer, and the first conductive connection part and the second conductive connection part are fabricated by using the intermediate source-drain metal layer.

19. A display device, comprising the display substrate according to claim 1, wherein the display device further comprises an encapsulation layer and a driving chip, the driving chip is coupled to the display substrate, and the encapsulation layer covers the display substrate.

* * * * *